US009722006B2

United States Patent
Nishimura et al.

(10) Patent No.: US 9,722,006 B2
(45) Date of Patent: Aug. 1, 2017

(54) ORGANIC LIGHT-EMITTING DEVICE AND METHOD FOR PRODUCING SAME

(75) Inventors: Masaki Nishimura, Osaka (JP); Hideaki Matsushima, Hyogo (JP); Yumeji Takashige, Osaka (JP)

(73) Assignee: JOLED INC., Tokyo (JP)

( * ) Notice: Subject to any disclaimer, the term of this patent is extended or adjusted under 35 U.S.C. 154(b) by 22 days.

(21) Appl. No.: 14/377,950

(22) PCT Filed: Aug. 2, 2012

(86) PCT No.: PCT/JP2012/004923
§ 371 (c)(1),
(2), (4) Date: Aug. 11, 2014

(87) PCT Pub. No.: WO2013/124916
PCT Pub. Date: Aug. 29, 2013

(65) Prior Publication Data
US 2015/0028315 A1  Jan. 29, 2015

(30) Foreign Application Priority Data

Feb. 21, 2012 (JP) .................................. 2012-034967

(51) Int. Cl.
*H01L 27/32* (2006.01)
*H01L 51/52* (2006.01)
(Continued)

(52) U.S. Cl.
CPC ........ *H01L 27/326* (2013.01); *H01L 27/3246* (2013.01); *H01L 27/3248* (2013.01);
(Continued)

(58) Field of Classification Search
CPC ..... H01L 27/32; H01L 51/0008; H01L 51/00; H01L 27/326; H01L 27/3246;
(Continued)

(56) References Cited

U.S. PATENT DOCUMENTS

| 5,443,922 A | 8/1995 | Nishizaki et al. |
| 2004/0119419 A1 | 6/2004 | Kai et al. |

(Continued)

FOREIGN PATENT DOCUMENTS

| CN | 1509127 | 6/2004 |
| JP | 05-163488 | 6/1993 |

(Continued)

OTHER PUBLICATIONS

International Search Report (ISR) in International Patent Application No. PCT/JP2012/004923, dated Nov. 13, 2012.

(Continued)

*Primary Examiner* — Fazli Erdem
(74) *Attorney, Agent, or Firm* — Greenblum & Bernstein, P.L.C.

(57) ABSTRACT

An organic light-emitting device includes at least an underlayer, a partition wall, and an organic film. The underlayer is disposed above a substrate. The partition wall covers a first part and surrounds a second part of the surface of the underlayer. The organic film includes organic material, is disposed in a recess formed by the partition wall surrounding the second part, and is in contact with the surface of the underlayer and a surface of the partition wall. The surface of the underlayer has a protruding portion that protrudes in an upward direction. The protruding portion is composed of a top surface and an inclined surface surrounding the top surface. The first part includes least the top surface and a portion of the inclined surface, and an inner edge of the partition wall is in contact with the inclined surface or a level portion of the surface of the underlayer.

13 Claims, 22 Drawing Sheets

(51) Int. Cl.
*H01L 51/56* (2006.01)
*H01L 51/00* (2006.01)

(52) U.S. Cl.
CPC ...... *H01L 27/3258* (2013.01); *H01L 51/0008* (2013.01); *H01L 51/5209* (2013.01)

(58) Field of Classification Search
CPC ............. H01L 27/3248; H01L 27/3258; H01L 51/5209; H01L 51/52; H01L 51/56
See application file for complete search history.

(56) References Cited

U.S. PATENT DOCUMENTS

| | | | |
|---|---|---|---|
| 2004/0201048 A1 | 10/2004 | Seki et al. | |
| 2005/0170076 A1 | 8/2005 | Seki et al. | |
| 2005/0170550 A1 | 8/2005 | Seki et al. | |
| 2005/0186403 A1 | 8/2005 | Seki et al. | |
| 2006/0158107 A1 | 7/2006 | Kai et al. | |
| 2008/0290789 A1* | 11/2008 | Kai | H01L 27/3246 313/504 |
| 2009/0020751 A1 | 1/2009 | Seki et al. | |
| 2009/0284820 A1* | 11/2009 | Ejima | G02B 5/22 359/237 |
| 2010/0090203 A1* | 4/2010 | Obata | H01L 51/5012 257/40 |
| 2010/0164372 A1 | 7/2010 | Kai et al. | |
| 2010/0193817 A1* | 8/2010 | Amamiya | H01L 51/5004 257/98 |
| 2012/0001186 A1* | 1/2012 | Kondoh | H01L 27/3246 257/59 |
| 2012/0032207 A1* | 2/2012 | Nishiyama | H01L 27/3248 257/89 |
| 2012/0091439 A1* | 4/2012 | Nishiyama | H01L 27/3216 257/40 |
| 2013/0126847 A1 | 5/2013 | Harada et al. | |
| 2013/0134403 A1 | 5/2013 | Harada et al. | |
| 2013/0193427 A1* | 8/2013 | Kurata | H01L 51/5265 257/40 |

FOREIGN PATENT DOCUMENTS

| | | |
|---|---|---|
| JP | 11-087062 | 3/1999 |
| JP | 2006-086128 | 3/2006 |
| JP | 2007-026866 | 2/2007 |
| JP | 2007-123286 | 5/2007 |
| JP | 2007-287346 | 11/2007 |
| JP | 2009-272588 | 11/2009 |

OTHER PUBLICATIONS

Office Action from State Intellectual Property Office (SIPO) of the People's Republic of China in Chinese Patent Application No. 2012/80069848.9, dated Jan. 18, 2016, together with a partial English language translation.

\* cited by examiner

FIG. 5A
FIG. 5B
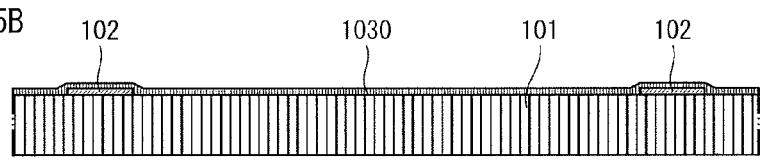
FIG. 5C
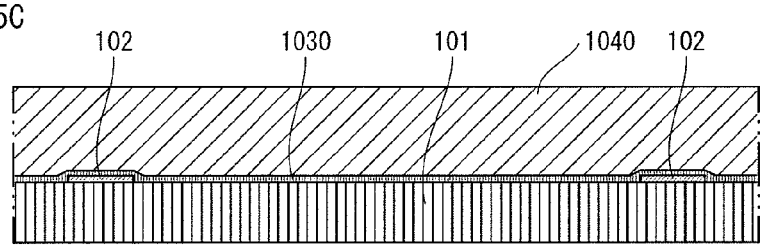
FIG. 5D
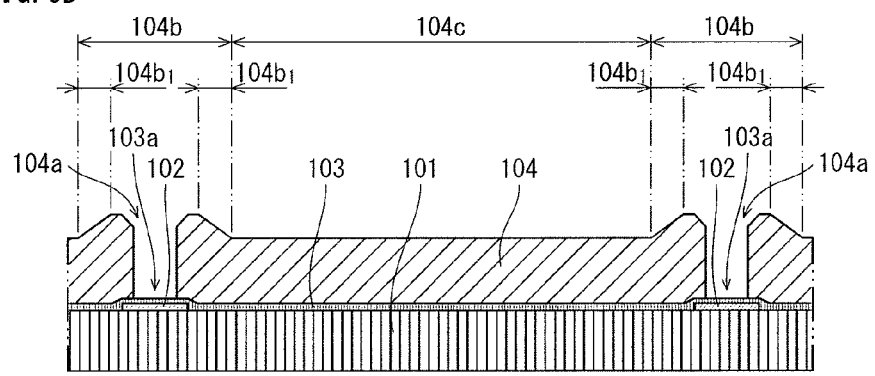
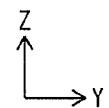

FIG. 6A
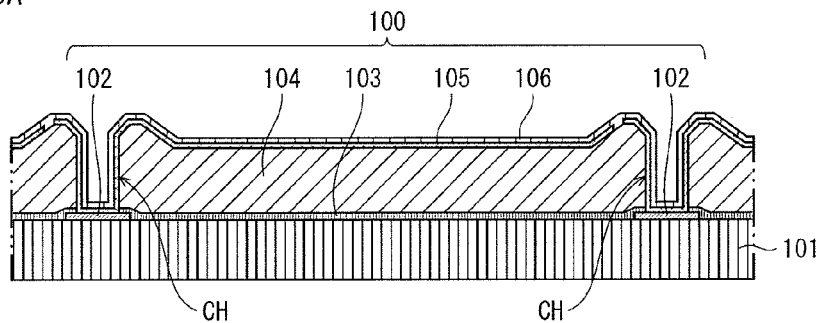
FIG. 6B
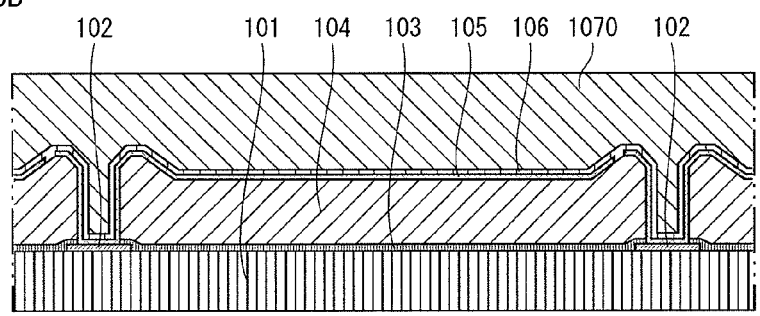
FIG. 6C
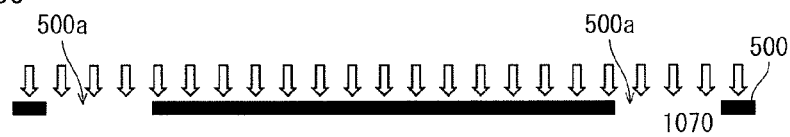
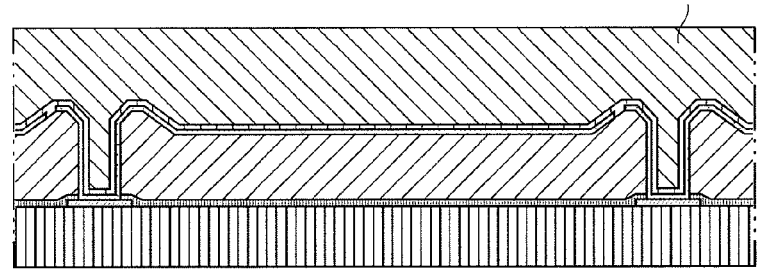
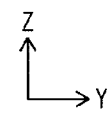

FIG. 13

| Ink drop quantity | State after application | Underlayer protrusion height (b) | Film thickness of organic film (a) | b/a | Uncovered occurrence | Overflow occurrence | Judgment |
|---|---|---|---|---|---|---|---|
| 2 d | (C₁) | 150 nm | 1.5 nm | 100 | Yes | No | × |
| 3 d | (C₂) | 150 nm | 4.0 nm | 37.5 | Yes | No | × |
| 4 d | (C₃) | 150 nm | 6.1 nm | 25 | Yes | No | × |
| 7 d | | 150 nm | 10.0 nm | 15 | No | No | ○ |
| 9 d | | 150 nm | 13.2 nm | 11.5 | No | No | ○ |
| 10 d | | 150 nm | 14.0 nm | 10.7 | No | No | ○ |
| 11 d | | — | — | — | No | Yes | × |
| 12 d | | — | — | — | No | Yes | × |

ORGANIC LIGHT-EMITTING DEVICE AND METHOD FOR PRODUCING SAME

TECHNICAL FIELD

The present invention is related to organic light-emitting devices and methods for manufacturing organic light-emitting devices.

BACKGROUND ART

In recent years, research and development of organic electroluminescence (EL) devices has been advancing. Organic EL devices are light-emitting devices that use the EL phenomenon of solid fluorescent/phosphorescent material. As an example of an organic EL device pertaining to conventional technology, an organic EL panel is described below using FIG. 21.

As illustrated in FIG. 21, in the organic EL panel pertaining to conventional technology, a thin film transistor (TFT) 902 is disposed on an upper surface in a Z-axis direction of a substrate 901 (in FIG. 21, only the drain of the TFT is shown). The TFT 902 and the substrate 901 are covered by a passivation film 903 and, above the passivation film 903, an interlayer insulating film 904. Note that the portion of the passivation film 903 and the interlayer insulating film 904 above the drain of the TFT 902 is open (contact hole CH).

In this case of the organic EL panel, an anode 905 is disposed above the interlayer insulating film 904 for each sub-pixel. The anode 905 is joined to the drain of the TFT 902 at the bottom of the contact hole CH. Above the anode 905, a partition wall (bank) 907, which partitions sub-pixels, protrudes above the contact hole CH. At least a surface of the partition wall 907 has liquid repellency.

In each recess formed by the partition wall 907 surrounding an area, a hole injection layer 906, a hole transport layer 908, and a light-emitting layer 909 are disposed in the order stated. In successive unbroken layers above the light-emitting layer 909 and the partition wall 907, an electron injection layer 910, a cathode 911, and a sealant layer 912 are disposed in the order stated.

Above the sealant layer 912, a color filter (CF) substrate 916 composed of a substrate 913, a color filter 914, and a black matrix 915 is joined to the sealant layer 912 by an adhesive resin layer 917.

Here, with respect to the organic EL panel pertaining to conventional technology illustrated in FIG. 21, when forming organic films such as the hole injection layer 906, ink that contains organic material is applied into a recess formed by the partition wall 907 surrounding an area, then dried. Alternatively, such organic films may be formed within the recess through a vapor-deposition method.

CITATION LIST

Patent Literature

[Patent Literature 1]
Japanese Patent Application Publication No. H11-87062

SUMMARY OF INVENTION

Technical Problem

However, in the organic EL device pertaining to conventional technology, cases occur in which a protruding portion is formed in the interlayer insulating film 904, and such a protruding portion may cause an organic film formed thereon to lose film thickness uniformity. In a case in which film thickness uniformity of an organic film is lost, the non-uniform portion may exhibit luminance concentration, for example, thereby causing a decrease in the life of the organic EL device.

Further, when an area in which an organic film is not formed occurs, a situation may occur in which an undesirable leakage path is formed between the anode 905 and the cathode 911.

The present invention resolves problems such as described above, and provides an organic light-emitting device that has excellent light-emitting performance and a high film thickness precision with respect to an organic film formed in a recess formed by a partition wall surrounding an area, and a method for manufacturing the organic light-emitting device.

Solution to Problem

The organic light-emitting device pertaining to one aspect of the present invention has the following structure.

The organic light-emitting device pertaining to one aspect of the present invention includes at least an underlayer, a partition wall, and an organic film.

The underlayer is disposed above a substrate. The partition wall covers a first part of a surface of the underlayer, and surrounds a second part of the surface of the underlayer. The organic film includes organic material, is disposed in a recess formed by the partition wall surrounding the second part, and is in contact with the surface of the underlayer and a surface of the partition wall.

In the organic light-emitting device pertaining to one aspect of the present invention, the surface of the underlayer has a protruding portion that protrudes in an upward direction. The protruding portion is composed of a top surface and an inclined surface that surrounds the top surface. Further, a feature of the present invention is that the first part includes at least the top surface and a portion of the inclined surface, and an inner edge of the partition wall is in contact with the inclined surface or a level portion of the surface of the underlayer that is not the protruding portion.

Advantageous Effects of Invention

In the organic light-emitting device pertaining to one aspect of the present invention, the protruding portion of the surface of the underlayer protrudes in the upward direction, and the partition wall covers the entirety of the top surface and at least a portion of the inclined surface of the protruding portion. Further, the inner edge of the partition wall is in contact with the inclined surface of the protruding portion or the level portion that is not the protruding portion. In the organic light-emitting device pertaining to one aspect of the present invention, the top surface that is the highest part of the protruding portion and at least a portion of the inclined surface that surrounds the top surface are covered by the partition wall. Thus, the organic thin has high film thickness uniformity, without localized points of thin film thickness and gaps in film coverage occurring.

Accordingly, in the organic light-emitting device pertaining to one aspect of the present invention, the organic film having a high film thickness precision is disposed in the recess formed by the partition wall surrounding an area, and the organic light-emitting device has excellent light-emitting performance.

BRIEF DESCRIPTION OF DRAWINGS

FIG. 5A to FIG. 5D are schematic cross-sectional views illustrating cross-section structures in part of a process of manufacturing the organic EL panel 10.

FIG. 6A to FIG. 6C are schematic cross-sectional views illustrating cross-section structures in part of the process of manufacturing the organic EL panel 10.

FIG. 13 is a table illustrating states of ink for each ink drop quantity.

EMBODIMENTS

Background of the Present Invention

Background of the present invention is described below, using FIG. 22.

First, when the inventors prepared an organic light-emitting device, the inventors found that unevenness of light-emission luminance occurred between a central area of a sub-pixel and an end area of the sub-pixel near an inner edge of a bank. Regarding the cause, the inventors considered that the following phenomenon occurs.

Figure 22A:
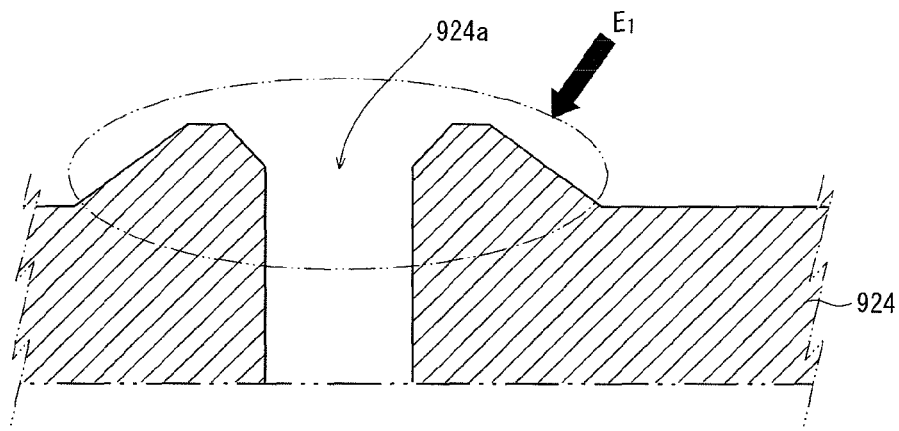
FIG. 22A is a schematic cross-sectional view illustrating a relationship between a contact hole 924a and a surface shape of an interlayer insulating film 924.

As illustrated in FIG. 22A, after a hole 924a is formed in a portion of the interlayer insulating film 924, a protruding portion having an upward convex shape remains (the portion indicated by arrow $E_1$) in a Z-axis direction surface of the interlayer insulating film 924. The detailed mechanism by which the protruding portion occurs is unclear, but it is thought that exposure and the like for forming the hole 924a in the interlayer insulating film 924 is a cause.

Figure 22B:
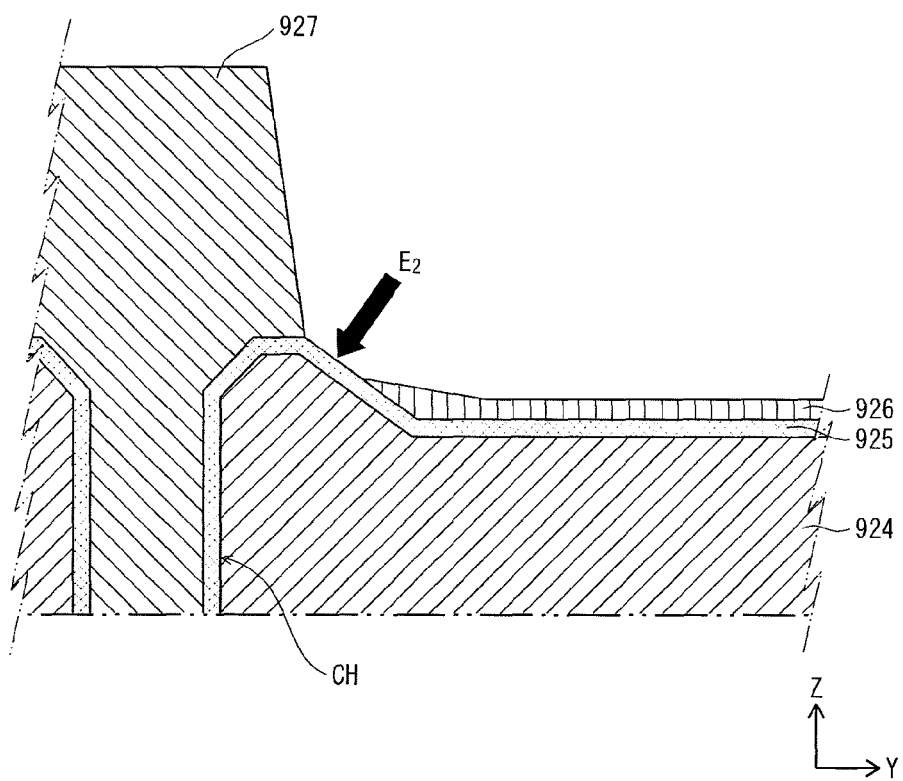
FIG. 22B is a schematic cross-sectional view illustrating a relationship between a protruding portion of the interlayer insulating film 924 and a form of a hole injection layer 926.

Next, as illustrated in FIG. 22B, an anode 925 is disposed so as to cover the surface of the interlayer insulating film 924. The anode 925 is also formed on surfaces defining the hole 924a in the interlayer insulating film 924, and in this way the anode 925 and a drain of the TFT 902 are put in contact via the contact hole CH. After a partition wall 927 is formed so as to cover the contact hole CH, for example, ink that contains organic material is applied by an application method to a surface of the anode 925, which is the surface of an underlayer, and a hole injection layer 926 is formed by the ink being dried. However, as illustrated by the portion indicated by the arrow $E_2$ in FIG. 22B, a portion of the anode 925 at an inclined surface of the protruding portion may be exposed and not covered by the hole injection layer 926. In this way, in a case in which a portion of the anode 925 is not covered by the hole injection layer 926, even if a light-emitting layer is disposed above the hole injection layer 926, the light-emitting layer will not emit light normally, and a reduction in light-emitting performance will result.

Further, in a case in which an uncovered area occurs in which the organic film is not formed, as described above, depending on a desired value of film thickness of the organic film, it may become difficult to ensure a safe range for ink application. In such a case, it may occur that there is no choice but to determine a value of film thickness based on manufacturing constraints.

In this way, the inventors found that size of the partition wall and position of an inner edge of the partition wall are important factors to form an organic film having a high film thickness uniformity. Note that in FIG. 22B, forming an organic film using an application method is given as an example. However, due to the existence of the protruding portion, film thickness uniformity of the organic film may also be lost when forming an organic film using a vapor deposition method, causing luminance concentration and lifespan reduction.

Aspects of the Present Invention

The aspects of the present invention are provided in light of the background described above.

An organic light-emitting device pertaining to one aspect of the present invention includes at least an underlayer, a partition wall, and an organic film.

The underlayer is disposed above a substrate. The partition wall covers a first part of a surface of the underlayer and surrounds a second part of the surface of the underlayer. The organic film includes organic material, is disposed in a recess formed by the partition wall surrounding the second part, and is in contact with the surface of the underlayer and a surface of the partition wall.

In the organic light-emitting device pertaining to one aspect of the present invention, the surface of the underlayer has a protruding portion that protrudes in an upward direction. The protruding portion is composed of a top surface and an inclined surface that surrounds the top surface. Further, a feature of the present invention is that the first part includes least the top surface and a portion of the inclined surface, and that an inner edge of the partition wall is in contact with the inclined surface or a level portion of the surface of the underlayer that is not the protruding portion.

In the organic light-emitting device pertaining to one aspect of the present invention, due to the organic light-emitting device having the above-described structure, localized areas of thin film thickness and uncovered areas in which a film is not formed do not occur, and an organic film having a high film thickness uniformity is achieved.

Accordingly, in the organic light-emitting device pertaining to one aspect of the present invention, the organic film having a high film thickness precision is disposed in the recess formed by the partition wall surrounding an area, and the organic light-emitting device having excellent light-emitting performance is achieved.

Note that in a case in which the organic film is formed using an application method, if the position of the inner edge of the partition wall with respect to the surface of the underlayer is at a portion of the inclined surface of the protruding portion or the level portion, an area in which the organic film does not cover the underlayer is prevented. Such an area is hereafter referred to as an "uncovered area". Accordingly, in a case in which the organic film is formed using an application method, uneven luminance is prevented, and excellent light-emitting performance is achieved.

On the other hand, in a case in which the organic film is formed by using a vapor deposition method, and in particular when the position of the inner edge of the partition wall is at the level portion, uniformity of film thickness is maintained, and excellent light-emitting performance is achieved without uneven luminance.

Further, in the organic light-emitting device pertaining to one aspect of the present invention, the organic film may be formed by drying an applied film that is formed by applying ink that contains an organic material. If a2 is an average film thickness in nanometers of the organic film above the level portion and b is a difference in height in nanometers of a position where the inner edge of the partition wall contacts the surface of the underlayer and the level portion, the following relationship may be satisfied:

$$(b/a2) \leq 15 \qquad [\text{Math 1}]$$

By configuring the partition wall and the organic film so as to satisfy the above described relationship of Math 1, occurrence of an uncovered area in which the organic film is not formed on the inclined surface of the protruding portion is effectively prevented, while maintaining a high aperture ratio of the recess surrounded by the partition wall. Accordingly, the organic light-emitting device pertaining to one aspect of the present invention has excellent light-emitting performance.

Further, in the organic light-emitting device pertaining to one aspect of the present invention, the organic film may be formed by drying an applied film that is formed by applying ink that contains an organic material. The applied film may cover the entirety of the level portion, a portion of the inclined part of the protruding portion not covered by the partition wall, and a portion of the partition wall. The applied film may have a film thickness of a1 nanometers that is greater than b nanometers. Where an average film thickness of the organic film above the level portion is a2 nanometers and a difference in height of a position where the inner edge of the partition wall contacts the surface of the underlayer and the level portion is b nanometers, Math 1 is satisfied.

By configuring the height of the applied film and the height b of the partition wall so as to satisfy the above described relationship of Math 1, occurrence of an area in which the organic film is not formed on the inclined surface of the protruding portion is effectively prevented, while maintaining a high aperture ratio of the recess surrounded by the partition wall. Accordingly, the organic light-emitting device pertaining to one aspect of the present invention has an excellent light-emitting performance.

Further, in the organic light-emitting device pertaining to one aspect of the present invention, a difference in height of a position where the inner edge of the partition contacts the surface of the underlayer and the level portion may be equal to or less than 150 nanometers. By defining the height of the inner edge of the partition wall to be 150 nanometers or less, occurrence of an area on the inclined surface of the protruding part of the underlayer in which the organic film is not formed is effectively prevented. Accordingly, the organic light-emitting device pertaining to one aspect of the present invention has excellent light-emitting performance.

Further, in the organic light-emitting device pertaining to one aspect of the present invention, the underlayer may include an interlayer insulating film that has a contact hole and an electrode that is disposed on a surface of the interlayer insulating film and surfaces defining the contact hole. The organic film may be formed by drying an applied film that is formed by applying, on a surface of the electrode, ink that contains the organic material. The surface of the interlayer insulating film may have a protruding portion in a periphery of the contact hole that protrudes in an upward direction. The electrode may be disposed so as to follow the surface of the interlayer insulating film, such that a portion of the surface of the electrode above the protruding portion of the interlayer insulating film protrudes in an upward direction. The surface of the electrode may be the surface of the underlayer.

A manufacturing method for the organic light-emitting device pertaining to one aspect of the present invention includes: (i) a process of forming an underlayer, (ii) a process of forming a partition wall, (iii) a process of forming an applied film, and (iv) a process of forming an organic film.

(i) Process of forming the underlayer: Forming the underlayer above a substrate.

(ii) Process of forming the partition wall: Forming the partition wall to cover a first part of a surface of the underlayer so as to surround a second part of the surface of the underlayer.

(iii) Process of forming the applied film: Forming the applied film by applying ink containing organic material into a recess formed by the partition wall surrounding the second part.

(iv) Process of forming the organic film: Forming the organic film by drying the applied film, such that the organic film is in contact with a surface of the underlayer and a surface of the partition wall.

In a manufacturing method for the organic light-emitting device pertaining to one aspect of the present invention, (i) in forming the underlayer, the surface of the underlayer has a protruding portion that protrudes in an upwards direction, the protruding portion forming a top surface and an inclined surface that surrounds the top surface, and (ii) in forming the partition wall, the first part includes at least the top surface and a portion of the inclined surface, and an inner edge of the partition wall is in contact with the inclined surface or a level portion of the surface of the underlayer that is not the protruding portion.

In the manufacturing method for the organic light-emitting device pertaining to one aspect of the present invention, due to the above-described method being used, localized areas of thin film thickness and uncovered areas in which a film is not formed do not occur, and the organic film having high film thickness uniformity is achieved.

Accordingly, in the manufacturing method for the organic light-emitting device pertaining to one aspect of the present invention, the organic film having a high film thickness precision is disposed in the recess formed by the partition wall surrounding the second part, and manufacturing of the organic light-emitting device having excellent light-emitting performance is achieved.

Note that in a case in which the organic film is formed by using an application method, if the position of the inner edge of the partition wall with respect to the surface of the underlayer is at a portion of the inclined surface of the protruding portion, or the level portion, a so-called uncovered area in which the organic film does not cover the underlayer is prevented. Accordingly, in a case in which an organic film is formed using an application method, uneven luminance is prevented, and manufacturing of an organic light-emitting device having excellent light-emitting performance is achieved.

On the other hand, in a case in which an organic film is formed by using a vapor deposition method, and in particular when the position of the inner edge of the partition wall is at the level portion, uniformity of film thickness is maintained, and manufacturing of the organic light-emitting device having excellent light-emitting performance without uneven luminance is achieved.

A manufacturing method for the organic light-emitting device pertaining to one aspect of the present invention includes: (i) a process of forming an underlayer, (ii) a process of forming a partition wall, (iii) a process of forming an applied film, and (iv) a process of forming an organic film.

(i) Process of forming the underlayer: Forming the underlayer above a substrate.

(ii) Process of forming the partition wall: Forming the partition wall to cover a first part of a surface of the underlayer so as to surround a second part of the surface of the underlayer.

(iii) Process of forming the applied film: Forming the applied film by applying ink containing organic material into a recess formed by the partition wall surrounding the second part.

(iv) Process of forming the organic film: Forming the organic film by drying the applied film, such that the organic film is in contact with the surface of the underlayer and the surface of the partition wall.

In a manufacturing method for the organic light-emitting device pertaining to one aspect of the present invention, (i) in forming the underlayer, the surface of the underlayer has a protruding portion that protrudes in an upwards direction, the protruding portion forming a top surface and an inclined surface that surrounds the top surface, and (ii) in forming the partition wall, the first part includes at least the top surface and a portion of the inclined surface, and an inner edge of the partition wall is in contact with the inclined surface or a level portion of the surface of the underlayer that is not the protruding portion. Further, when forming the applied film, the applied film is applied to cover the entirety of the level portion, a portion of the inclined part of the protruding portion not covered by the partition wall, and a portion of the partition wall, and is applied to have a film thickness of a1 nanometers that is greater than b nanometers.

Furthermore, (iv) when forming the organic film, if a2 is an average film thickness in nanometers of the organic film above the level portion and b is a difference in height in nanometers of a position where the inner edge of the partition wall contacts the surface of the underlayer and the level portion, the following relationship is satisfied.

$$a1 > a2 \geq (b/15) \qquad \text{[Math 2]}$$

By configuring the height b of the partition wall, the film thickness a1 of the applied film, and the average film thickness a2 of the organic film so as to satisfy the above described relationship of Math 2, occurrence of an area in which the organic film is not formed on the inclined surface of the protruding portion is effectively prevented, while maintaining a high aperture ratio of the recess surrounded by the partition wall. Accordingly, in the manufacturing method of the organic light-emitting device pertaining to one aspect of the present invention, manufacturing of an organic light-emitting device having excellent light-emitting performance is achieved.

In the following, features and functions/effects of the present invention are described using specific examples. Note that the present invention is not limited to the following embodiments, with the exception of essential characteristic features thereof.

Embodiment 1

1. Structure of Organic EL Display Device 1

Figure 1:
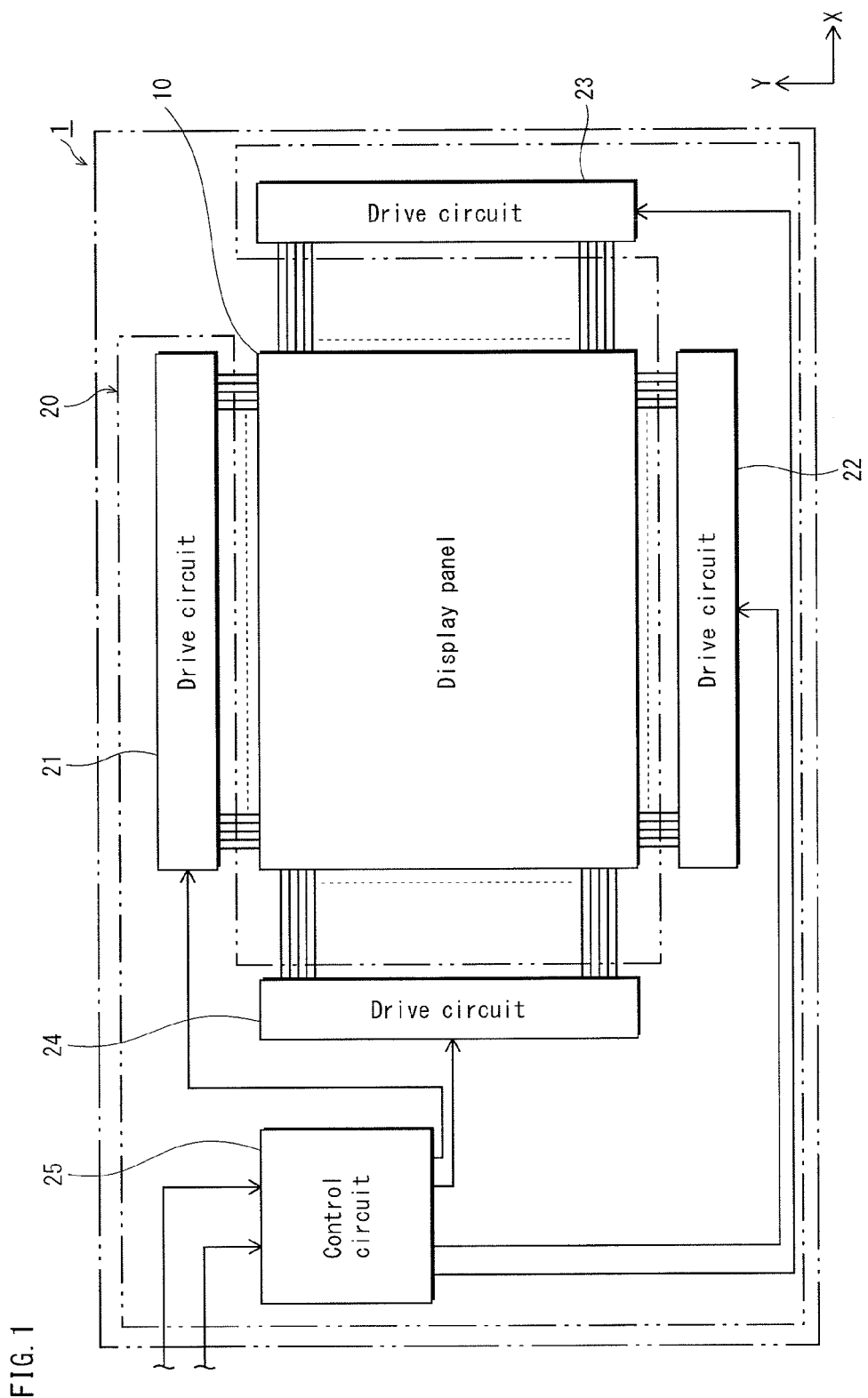
FIG. 1 is a schematic block diagram illustrating a structure of an organic EL display device pertaining to embodiment 1 of the present invention.

The structure of the organic EL display device 1 pertaining to embodiment 1 of the present invention is described using FIG. 1.

As illustrated in FIG. 1, the organic EL display device 1 has an organic EL panel 10 as one example of an organic light-emitting device, and, connected to the organic EL panel 10, a drive/control unit 20.

The organic EL panel 10 is a panel using the EL phenomenon of organic material, and a plurality of organic EL elements are, for example, arranged in a matrix. The drive/control unit 20 is composed of four drive circuits 21-24 and a control circuit 25.

Note that in the organic EL display device 1 pertaining to the present embodiment, the arrangement of the drive/control unit 20 with respect to the organic EL panel 10 is not limited in this way.

2. Structure of the Organic EL Panel 10

Figure 2:
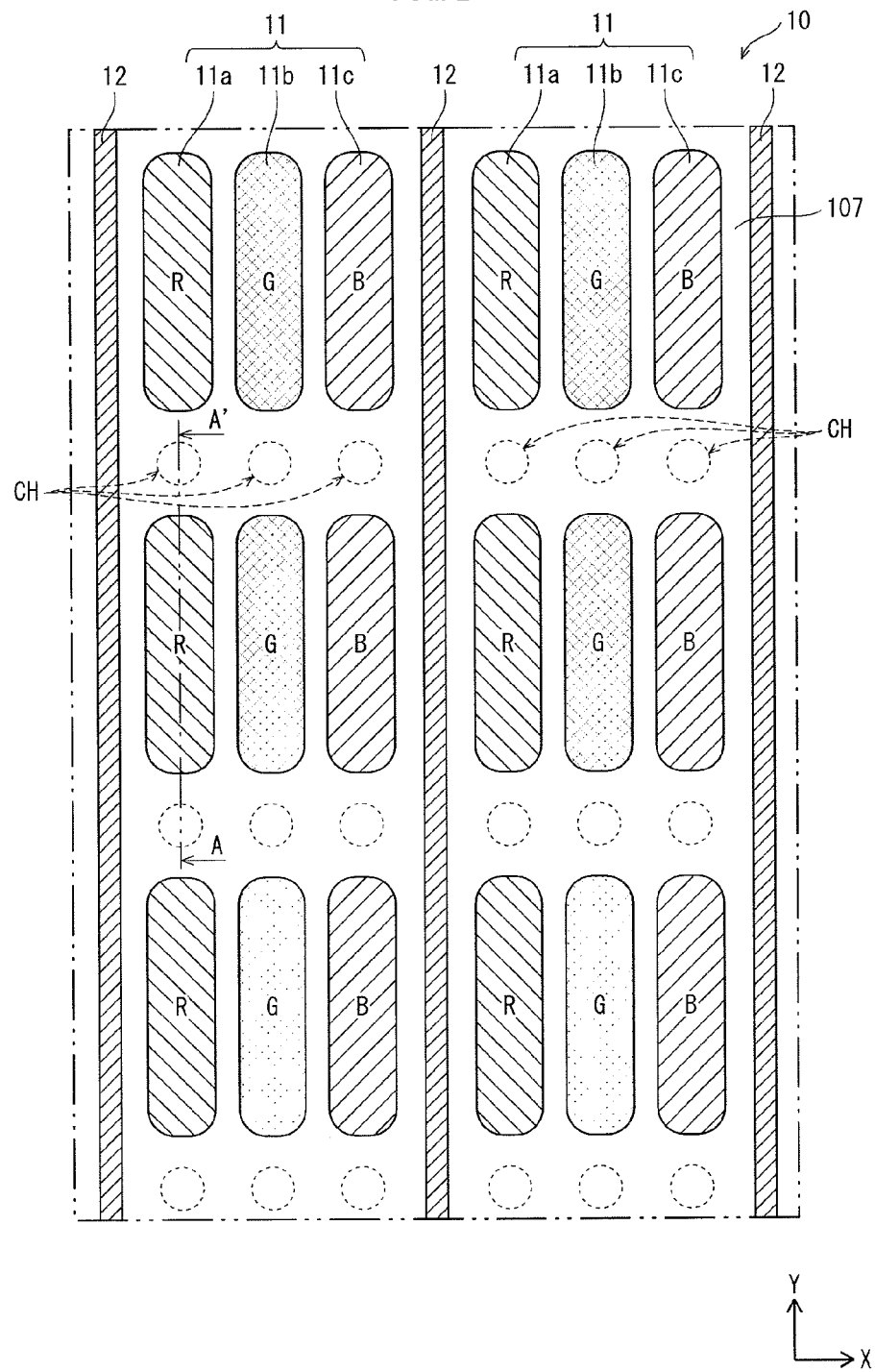
FIG. 2 is a schematic plan view illustrating pixels 11 in an organic EL panel 10.
Figure 3:
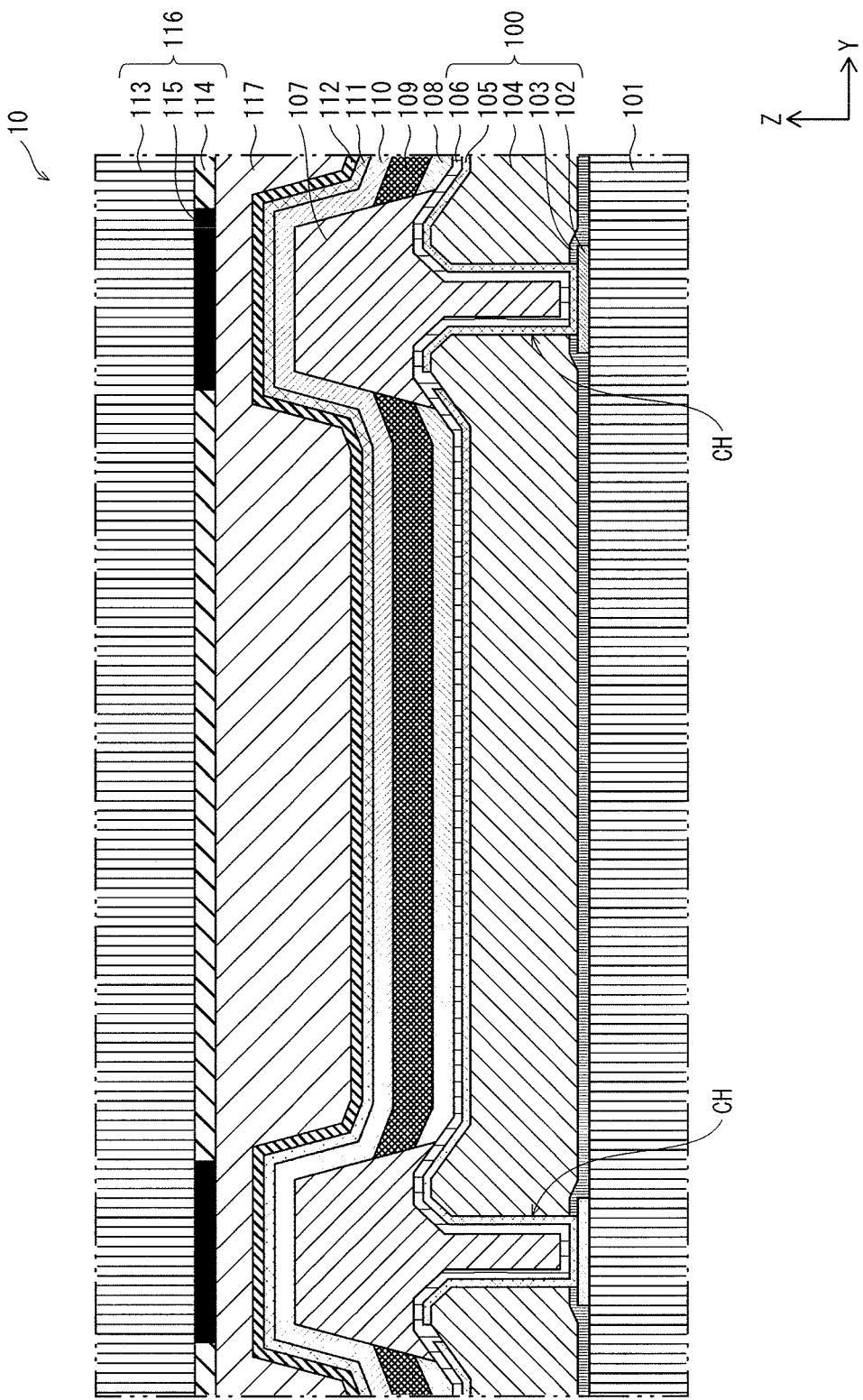
FIG. 3 is a schematic cross-sectional view illustrating a portion of the organic EL panel 10.

The structure of the organic EL panel 10 is described using FIG. 2 and FIG. 3. FIG. 2 is a schematic plan view illustrating pixels 11 in the organic EL panel 10. FIG. 3 is a schematic cross-sectional view illustrating an A-A' cross-section of FIG. 2.

As illustrated in FIG. 2, in the organic EL panel 10, each of the pixels 11 is composed of a combination of a sub-pixel 11a from which red (R) light is emitted, a sub-pixel 11b from which green (G) light is emitted, and a sub-pixel 11c from which blue (B) light is emitted. In the organic EL panel 10, in the X-Y plane, the pixels 11 are arranged in a matrix and a bus bar 12 that connects with a cathode is disposed between the pixels 11 that are adjacent in the X-axis direction.

Further, in the organic EL panel 10, below a partition wall 107 that separates adjacent sub-pixels 11a, 11b, 11c, a contact hole CH is arranged between each of the sub-pixels 11a, 11b, 11c that are adjacent in the Y-axis direction. Each contact hole CH is a connection path between an anode and a corresponding drain of a TFT.

Next, as illustrated in FIG. 3, in the organic EL panel 10 pertaining to embodiment 1, a thin film transistor (TFT) 102 is disposed on an upper surface in a Z-axis direction of a substrate 101 (in FIG. 3, only the drain of the TFT 102 is shown). The TFT 102 and the substrate 101 are covered by a passivation film 103 and, above the passivation film 103, an interlayer insulating film 104. Note that regarding the passivation film 103 and the interlayer insulating film 104, as described above, portions above the drain of the TFT 102 are open (contact hole CH). Further, a region surrounding the contact hole CH in the interlayer insulating film 104 protrudes further in the Z-axis direction than other regions of the interlayer insulating film 104. The protruding portion of the interlayer insulating film 104 in the region that occurs due to the contact hole CH is composed of a top surface and an inclined surface that surrounds the top surface.

In the organic EL panel 10, an anode 105 is disposed above the interlayer insulating film 104 for each sub-pixel 11a, 11b, 11c (see FIG. 2). The anode 105 is joined to the drain of the TFT 102 at the bottom of the contact hole CH. Above the anode 105, a hole injection layer 106 is disposed so as to span a plurality of the sub-pixels 11a, 11b, 11c.

Note that the hole injection layer 106 may also be disposed one-for-one for each sub-pixel 11a, 11b, 11c, so as not to span adjacent anodes 105.

Here, the anode 105 and the hole injection layer 106 are disposed following the surface of the interlayer insulating film 104, and, above the protruding portion of the interlayer insulating film 104, the surface of the hole injection layer 106 also protrudes following the protruding portion of the interlayer insulating film 104. In other words, when the TFT 102, the passivation film 103, the interlayer insulating film 104, the anode 105, and the hole injection layer 106, all above the substrate 101, are collectively called an underlying layer 100, a portion of the surface of the underlying layer 100 corresponding to the portion of the interlayer insulating film 104 surrounding the contact hole CH protrudes more than other portions of the surface of the underlying layer 100.

As illustrated in FIG. 3, the partition wall 107, which separates adjacent sub-pixels 11a, 11b, 11c, protrudes above the hole injection layer 106. In the organic EL panel 10 pertaining to the present embodiment, the partition wall 107 is disposed so as to cover the top surface of the protruding portion of the underlayer 100 surrounding the contact hole CH and a portion of the inclined surface that surrounds the top surface.

Note that the partition wall 107 is disposed so as to be present inside the contact hole CH, and at least the surface of the partition wall 107 has liquid repellency.

In each recess formed by the partition wall 107 surrounding an area, the hole transport layer 108 and the light-emitting layer 109, which are organic films, are disposed in the order stated. As described later, the hole transport layer 108 and the light-emitting layer 109 may, for example, be formed by an application method such as inkjet printing. Above the light-emitting layer 109 and the partition wall 107, in successive unbroken layers across a plurality of the sub-pixels 11a, 11b, 11c, an electron injection layer 110, a cathode 111, and a sealant layer 112 are disposed in the order stated.

Above the sealant layer 112, a color filter (CF) substrate 116 composed of a substrate 113, a color filter 114, and a black matrix 115 is joined to the sealant layer 112 by an adhesive resin layer 117.

Materials used in the formation of each component may, for example, be as follows:

(i) Substrate 101

The substrate 101 is formed using an insulating material as a base, such as alkali-free glass, soda glass, non-fluorescent glass, phosphate glass, borate glass, silica glass, acrylic resin, styrene resin, polycarbonate resin, epoxy resin, polyethylene, polyester, silicone resin, alumina, etc.

(ii) Interlayer Insulating Film 104

The interlayer insulating film 104 is formed using an organic compound such as polyimide, polyimide, acrylic resin, etc.

(iii) Anode 105

The anode 105 is formed using aluminium (Al), or silver (Ag), or an alloy containing aluminium (Al) and/or silver (Ag). In the case of the organic EL panel 10 pertaining to the present embodiment, which is a top emission type display panel, a material having a high light reflectivity at a surface thereof is preferable. In the present embodiment, as an example, the anode 105 is formed using an aluminium (Al) alloy.

(iv) Hole Injection Layer 106

The hole injection layer 106 is a layer that includes an oxide of tungsten (W), molybdenum (Mo), or nickel (Ni). When the hole injection layer 106 includes a metal oxide as described above, the hole injection layer 106 has functions of injecting holes with respect to the light-emitting layer 109 while stably generating holes or assisting in hole generation, and has a large work function.

Here, when the hole injection layer 106 includes a metal oxide as described above, multiple valences can be obtained and therefore multiple energy levels can be obtained. As a result, hole injection becomes easy, and a drive voltage is reduced. In particular, using tungsten oxide (WOx) is preferable from the viewpoint of having the functions of stably injecting holes and assisting hole generation.

(v) Partition Wall 107

The partition wall 107 is formed using an organic material such as a resin, and has insulation properties. Examples of the organic material that may be used to form the partition wall 107 are acrylic resin, polyimide resin, Novalac-type phenolic resin, etc. The partition wall 107 preferably has organic solvent resistance.

Further, during the manufacturing process, the partition wall 107 may be subjected to an etching process, a baking process, etc., and therefore the partition wall 107 is preferably formed from a material that has a high resistance to being excessively deformed or altered by such processes. Further, in order to have liquid repellency, material from which the partition wall 107 is formed may include a liquid repellent component, or the surface of the partition wall 107 may be fluorinated.

Note that in a case in which the partition wall 107 is formed using a lyophilic material, the lyophilic/liquid repellency difference between the surface of the partition wall 107 and the surface of the light-emitting layer 109 becomes small, and it becomes difficult to selectively retain ink containing the organic material that forms the light-emitting layer 109 within the recess formed by the partition wall 107 surrounding an area.

Further, the structure of the partition wall 107 is not limited to a single-layer structure as illustrated in FIG. 3, and a multi-layer structure of two or more layers may be used. In such a case, the above-described materials may be combined in each layer, and inorganic material or organic material may be used in each layer.

(vi) Hole Transport Layer 108

The hole transport layer 108 is formed using a polymer compound having no hydrophilic group. For example, a polymer compound having no hydrophilic group may be used such as polyfluorene and derivatives thereof, or polyarylamine and derivatives thereof, etc.

(vii) Light-Emitting Layer 109

The light-emitting layer 109, as described above, has a function of emitting light when an excited state is generated by the injection and recombination of holes and electrons. Material used to form the light-emitting layer 109 is an organic material having a light-emitting property that can be made into a film using a wet printing method.

In particular, the light-emitting layer 109 is preferably formed using fluorescent material such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of an 8-hydroxyquinoline compound, metal complex of a 2-bipyridine compound, complex of a Schiff base and a group 3 metal, metal complex of oxine, or rare earth complex, as disclosed in Japanese Patent Application Publication No. H5-163488.

(viii) Electron Injection Layer 110

The electron injection layer 110 has a function of injecting and transporting electrons injected thereto from the cathode 111 to the light-emitting layer 109, and is formed using such material as an oxidiazole derivative (OXD), a triazole derivative (TAZ), a phenanthroline derivative (BCP, Bphen), etc.

Note that a dry process such as a vapor-deposition method, using an alkali metal such as barium (Ba), may be used to form the electron injection layer 110.

(ix) Cathode 111

The cathode 111 is formed using, for example, indium tin oxide (ITO), or indium zinc oxide (IZO). In the case of the organic EL panel 10 pertaining to the present embodiment, which is a top emission display panel, the cathode 111 is preferably formed from a material that is light transmissive. A light transmittance of 80% or greater is preferable.

(x) Sealant Layer 112

The sealant layer 112 has a function of suppressing exposure to moisture and air of an organic film, such as the light-emitting layer 109, and is formed using a material such as silicon nitride (SiN), silicon oxynitride (SiON), etc. Further, above a layer formed using a material such as silicon nitride (SiN), silicon oxynitride (SiON), etc., a sealing resin layer including a resin material such as acrylic resin, silicone resin, etc., may be provided.

In the case of the organic EL panel 10 pertaining to the present embodiment, which is a top emission display panel, the sealant layer 112 is preferably formed using a material that is light transmissive.

3. Partition Wall 107 and Hole Transport Layer 108

Figure 4:
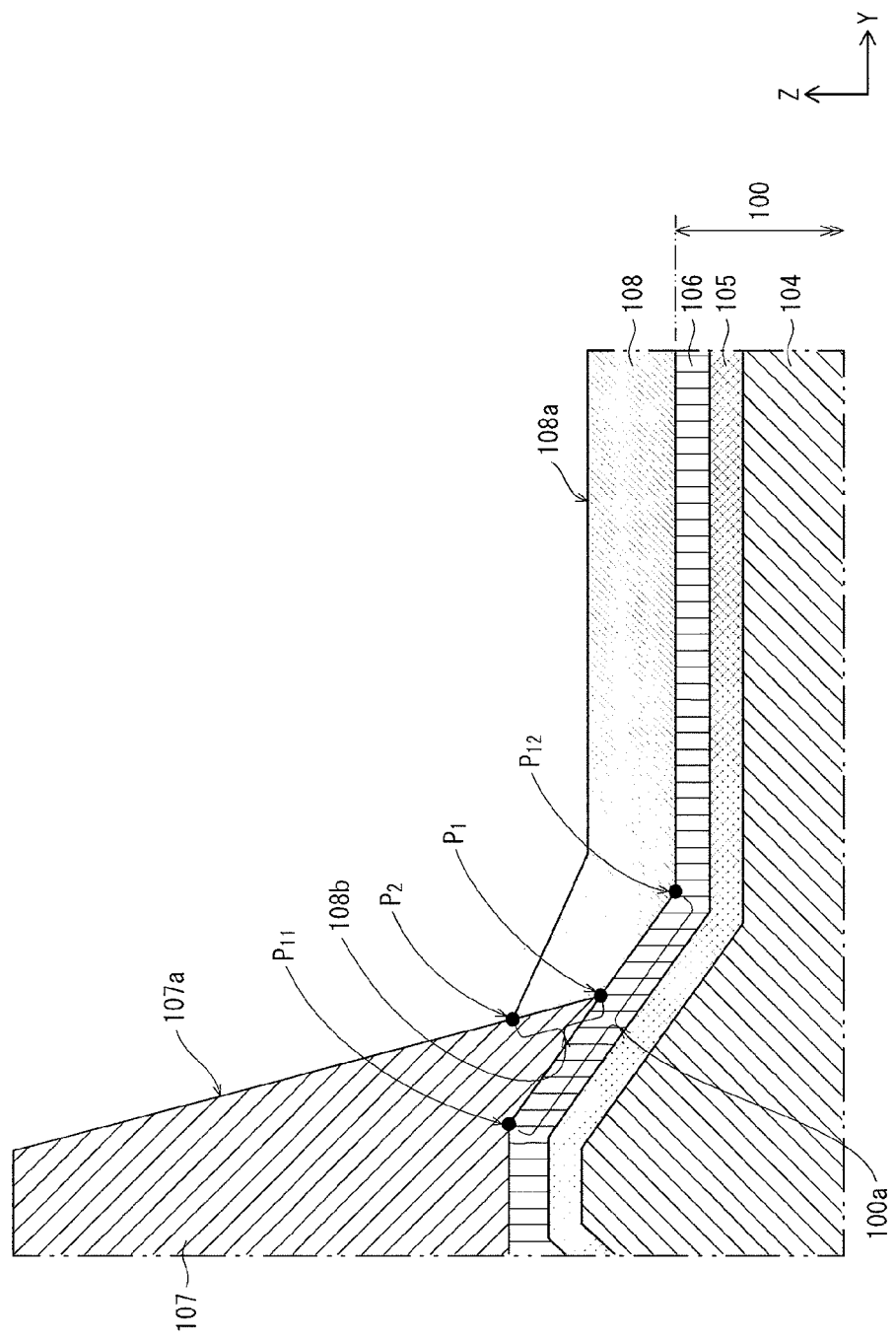
FIG. 4 is a schematic cross-sectional view illustrating positional relationships of a partition wall 107 and a hole transport layer 108 in the organic EL panel 10.

The relation between the position of the inner edge of the partition wall 107 and the form of the hole transport layer 108 is described using FIG. 4.

As shown in FIG. 4, the surface of the hole injection layer 106, which is the surface of the underlayer 100, has a protruding portion that corresponds to the protruding portion of the interlayer insulating film 104 surrounding the contact hole CH (see FIG. 3 and other drawings). In the organic EL panel 10 pertaining to the present embodiment, an inner edge $P_1$ of the partition wall 107 is positioned along an inclined surface 100a of the protruding portion of the underlayer 100. That is, in the organic EL panel 10, the inner edge $P_1$ of the partition wall 107 is defined as being between boundaries $P_{11}$ and $P_{12}$ of the inclined surface 100a of the surface of the underlayer 100.

The hole transport layer 108 is formed so as to be in contact with the surface of the hole injection layer 106 that is not covered by the partition wall 107 and a portion of an inclined surface 107a of the partition wall 107. In other words, a surface 108a of the hole transport layer 108 has a contact point $P_2$ at a point along the inclined surface 107a of the partition wall 107, and a partial region 108b of the hole transport layer 108 is in contact with the inclined surface 107a of the partition wall 107.

4. Manufacturing Method of Organic EL Panel 10

A manufacturing method of the organic EL panel 10 is described using FIG. 5A to FIG. 8C.

First, as illustrated in FIG. 5A, the substrate 101 is prepared. Next, as illustrated in FIG. 5B, the TFT 102 is formed on an upper surface in the Z-axis direction of the substrate 101 (in FIG. 5B and elsewhere, only the drain of the TFT 102 is illustrated), and the entire surface of the substrate 101 including the TFT 102 is coated by a passivation film 1030.

Next, as illustrated in FIG. 5C, an interlayer insulating film 1040 is deposited so as to cover the passivation film 1030. Next, as illustrated in FIG. 5D, a hole is opened in the interlayer insulating film 1040 above the drain of the TFT 102, and further, a hole is made in the passivation film 1030 at the bottom of the hole in the insulating film 1040. In this way, the drain of the TFT 102 is exposed via a hole 104a, 103a in the interlayer insulating film 104 and the passivation film 103.

Here, after the hole 104a in the interlayer insulating film 104 is opened, a region of the interlayer insulating film 104 surrounding the hole 104a protrudes comparatively higher in the Z-axis direction than other regions of the interlayer insulating film 104, as illustrated in FIG. 5D. That is, the surface of the interlayer insulating film 104 has a protruding portion 104b and a level portion 104c. The protruding portion 104b is composed of a top surface in the periphery of the hole 104a and an inclined surface $104b_1$ surrounding the top surface.

Next, as illustrated in FIG. 6A, the anode 105 and the hole injection layer 106 are deposited in turn, as films along the surface of the interlayer insulating film 104. The anode 105 and the hole injection layer 106 are also formed on surfaces defining the hole 104a of the interlayer insulating film 104, and at the bottom of the hole 104a, the anode 105 is connected to the drain of the TFT 102. In this way, the drain of the TFT 102 and the anode 105 are connected via the contact hole CH.

Formation of the anode 105 as described above is achieved by, for example, depositing a metal film (Al alloy film) using a method such as sputtering, vacuum vapor deposition, etc., followed by partitioning the metal film into sub-pixels 11a, 11b, 11c by using an etching process.

In the formation of the hole injection layer 106, sputtering is used, for example. Specifically, a mixed gas of argon (Ar) as an inert gas and oxygen (O) is introduced into a chamber of a sputtering device at a gas pressure of 4 Pa to 7 Pa, and a film is formed by using 0.7 kW to 1.5 kW of power. Note that in the mixed gas introduced into the chamber, the oxygen has a partial pressure ratio of 50% with respect to the total pressure.

Note that formation of the anode 105 and the hole injection layer 106 may also be achieved by using the following method.

First, a film including a metal (for example, an Al alloy) is formed, and then a film including a transition metal (for example, $WO_X$) is formed.

Next, the metal film and the metal oxide film is heat treated (for example, a calcination process at 230° C. or above), followed by partitioning the metal film into sub-pixels 11a, 11b, 11c by using an etching process, and thereby forming the anode 105 and the hole injection layer 106.

By the processes described above, formation of the underlayer 100 is completed.

Next, as illustrated in FIG. 6B, a partition wall resin layer 1070 is disposed above the hole injection layer 106. In the formation of the partition wall resin layer 1070, a material including a photosensitive resin component and a fluorine component may, for example, be deposited by a spin coating method.

Figure 7A:
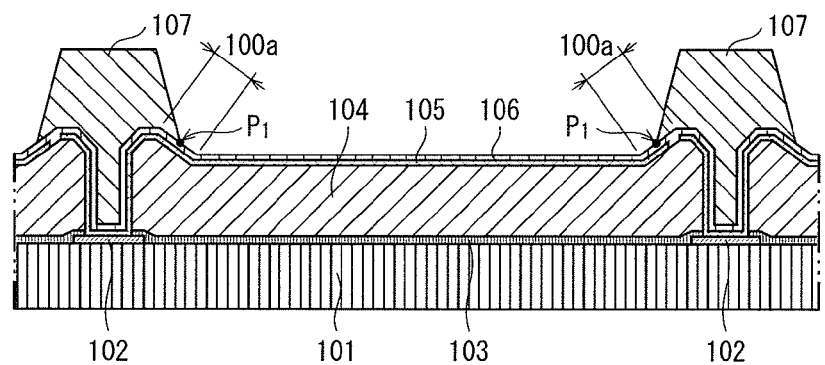
FIG. 7A to FIG. 7C are schematic cross-sectional views illustrating cross-section structures in part of the process of manufacturing the organic EL panel 10.

Next, as illustrated in FIG. 6C, a mask 500 that has openings 500a in regions where the partition wall 107 is to be formed is provided, and mask exposure is performed. Subsequently, as illustrated in FIG. 7A, patterning is performed by subjecting the partition wall resin layer 1070 to a developing process, and afterwards the partition wall 107 is formed by performing heat treatment such as calcination. The partition wall 107 is formed such that, within an area that is 20% to 40% of the total height of the partition wall 107, a taper angle is in a range of 20° to 70°. Further, liquid repellency is applied such that a contact angle with respect to anisole is in a range of 30° to 70°.

Note that formation of the partition wall 107 is performed, as a specific example, through exposure at all wavelengths, and puddle developing or spray developing using tetramethyl ammonium hydroxide (TMAH) developer. Afterwards, the partition wall 107 is finished by performing the steps of rinsing using pure water, and afterward calcification.

Here, as illustrated in FIG. 7A, the inner edge $P_1$ of the partition wall 107 is set at a position along the inclined surface 100a of the protruding portion of the underlayer 100 (corresponding to the inclined surface $104b_1$ of the protruding portion 104b of the interlayer insulating film 104). Details are as described above.

Figure 7B:
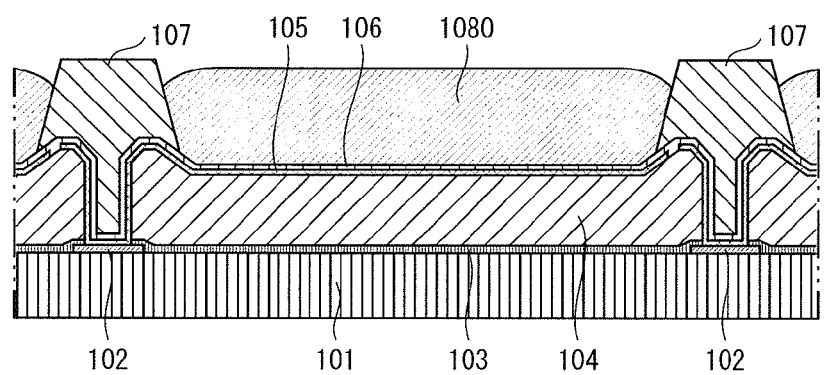
Figure 7C:
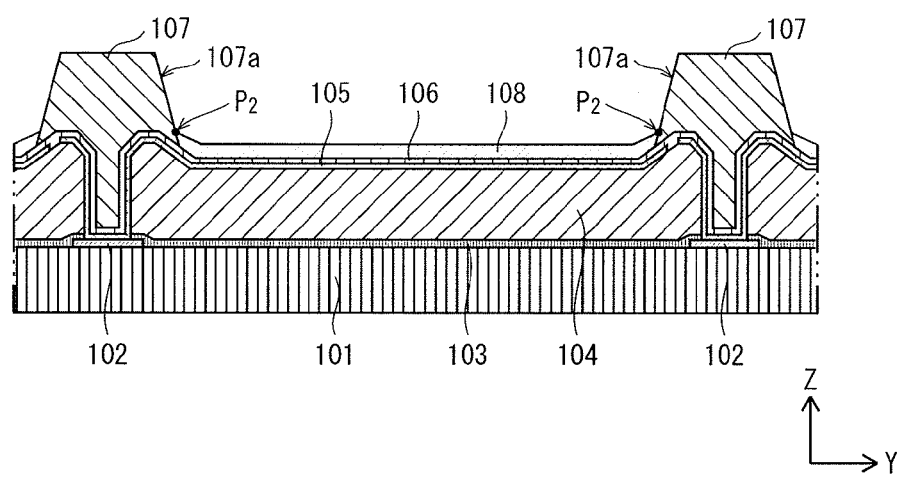

Next, as illustrated in FIG. 7B, ink 1080 for forming the hole transport layer 108 is applied to each recess that is formed by the partition wall 107 surrounding an area. Afterwards, by drying the ink 1080, formation of the hole transport layer 108 is completed, as illustrated in FIG. 7C. As illustrated in FIG. 7C, in the present embodiment, the surface of the hole transport layer 108 contacts the inclined surface 107a of the partition wall 107 at the contact point $P_2$.

Note that in the above description, the ink 1080 has a viscosity in a range of 0.1 cP to 20 cP (0.0001 Pa·s to 0.02 Pa·s) and a concentration in a range of 0.1% to 10%.

Figure 8A:
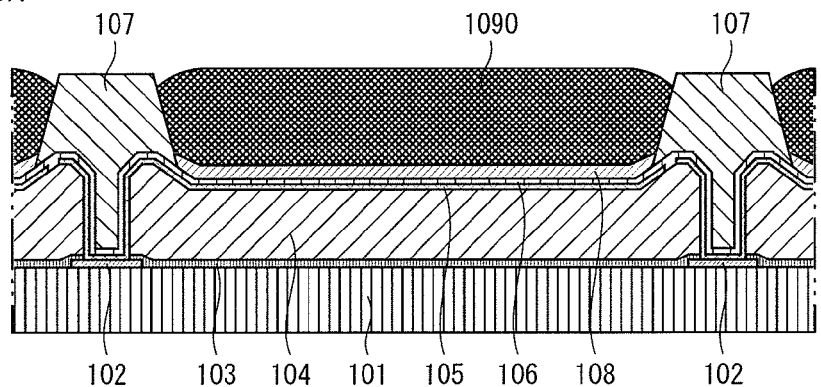
FIG. 8A to FIG. 8C are schematic cross-sectional views illustrating cross-section structures in part of the process of manufacturing the organic EL panel 10.
Figure 8B:
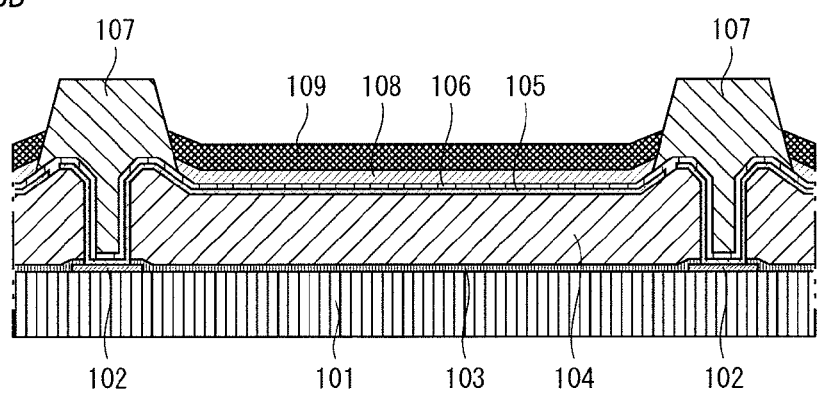

Next, as illustrated in FIG. 8A, ink 1090 for forming the light-emitting layer 109 is applied above the hole transport layer 108, within the recess formed by the partition wall 107 surrounding an area. Viscosity and concentration of the ink 1090 is defined as being in the same range of values as described with respect to the ink 1080. By drying the ink 1090, the light-emitting layer is formed, as illustrated in FIG. 8B.

Here, as illustrated in FIG. 7C, by forming the hole transport layer 108 with respect to the underlayer 100 while defining the inner edge of the partition wall 107 as described above, an uncovered area does not occur and, after formation of the hole transport layer 108, the underlayer 100 is not exposed. Thus, direct contact between the hole injection layer 106 and the light-emitting layer 109 without the hole transport layer 108 therebetween does not occur.

Figure 8C:
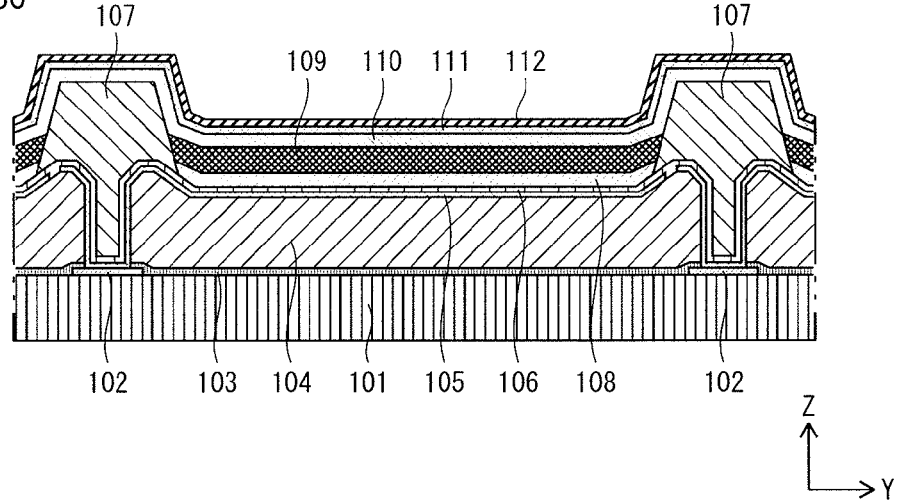

Next, as illustrated in FIG. 8C, above the light-emitting layer 109 and exposed surfaces of the partition wall 107, the electron injection layer 110, the cathode 111, and the sealant layer 112 are disposed in the stated order. Manufacturing of the organic EL panel 10 is finished by bonding to a CF substrate 116.

Note that, as illustrated in FIG. 1, the organic EL display device 1 is completed by connecting the drive/control unit 20 with respect to the organic EL panel 10, and subjecting the organic EL panel 10 to an aging process as required.

5. Inner Edge of Partition Wall 107

Figure 9:
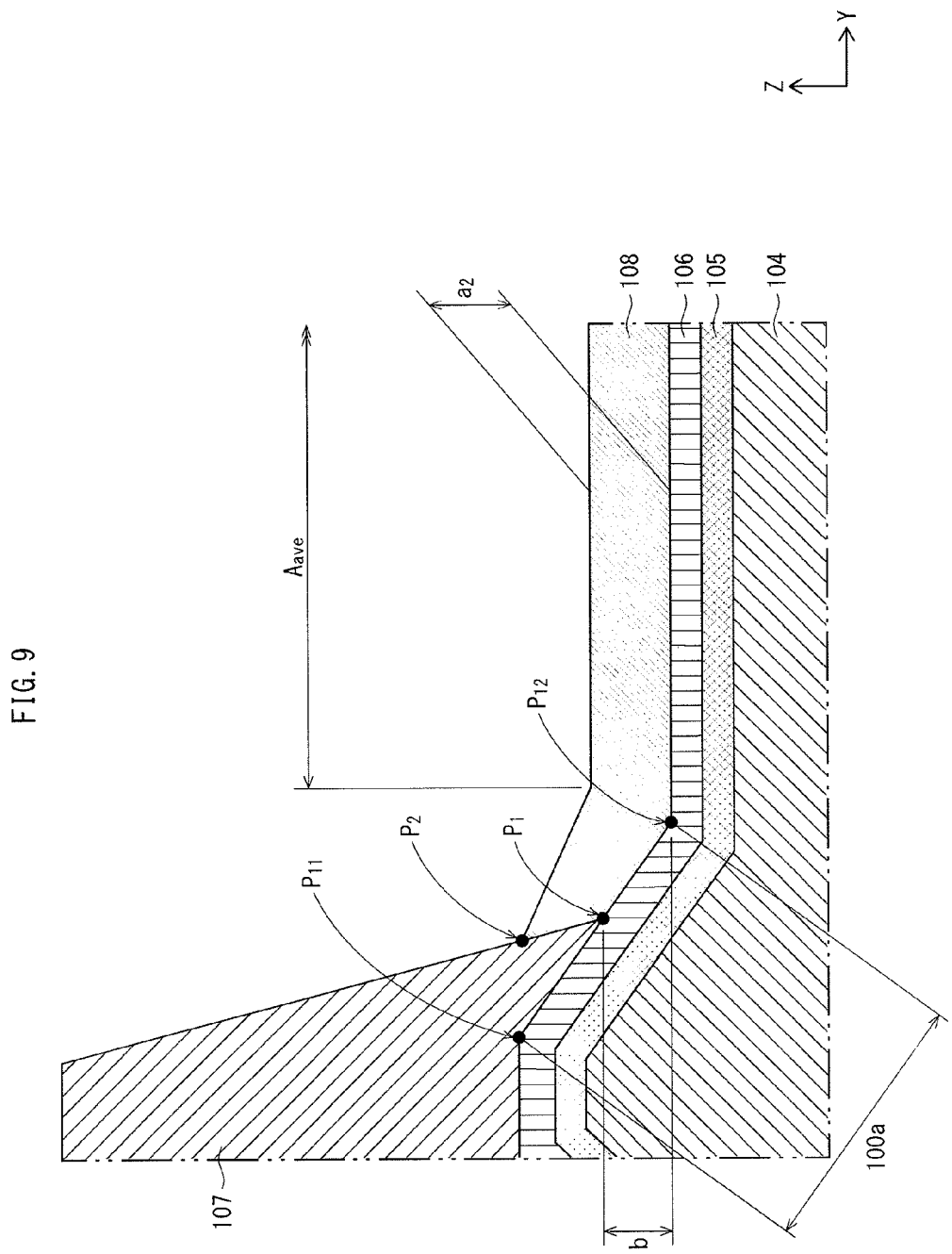
FIG. 9 is a schematic cross-sectional view illustrating a relationship between height of an inner edge of the partition wall 107 and film thickness of the hole transport layer 108 in the organic EL panel 10.
Figure 10A:
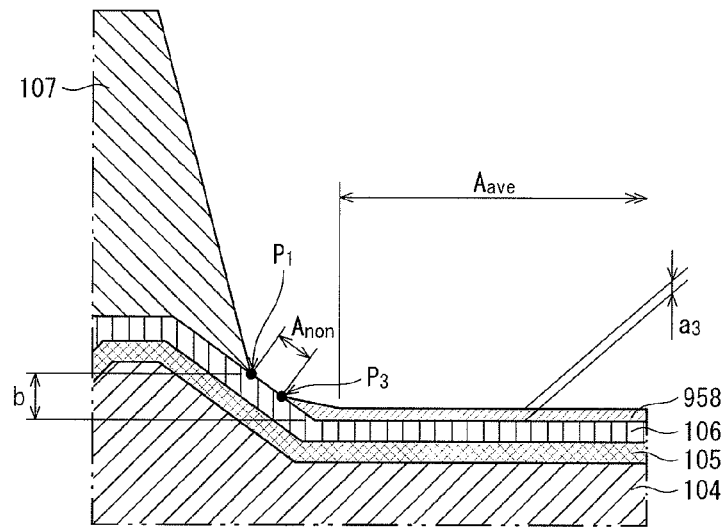
FIG. 10A and FIG. 10B are schematic cross-sectional views illustrating a relationship between height of an inner edge of a partition wall and film thickness of a hole transport layer in an organic EL panel pertaining to a comparative example.
Figure 10B:
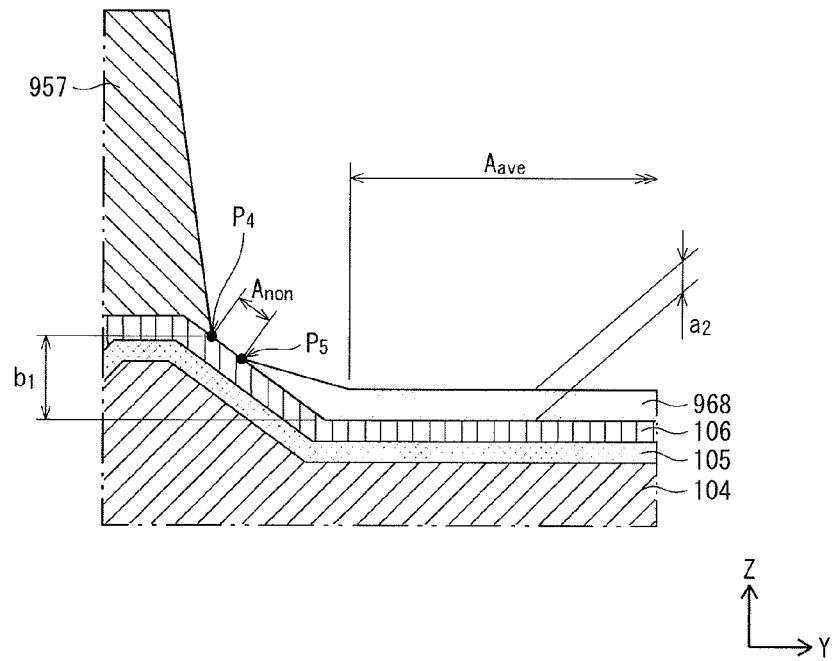

A position of the inner edge of the partition wall 107 that is more preferable in terms of increasing film thickness uniformity of organic films is described using FIG. 9, FIG. 10A, and FIG. 10B.

As illustrated in FIG. 9, in the organic EL panel 10, the inner edge $P_1$ of the partition wall 107 is in contact with the surface of the underlayer 100, which is the surface of the hole injection layer 106, at a position along the inclined surface 100a of the protruding portion of the underlayer 100. The hole transport layer 108, which is an organic film, is formed so as to cover all of the surface of the hole injection layer 106 that is not covered by the partition wall 107 and a portion of the inclined surface of the partition wall 107. The surface of the hole transport layer 108 and the inclined surface of the partition wall 107 contact at the contact point $P_2$.

Here, b denotes a height in the Z-axis direction from a lower end position of the protruding portion of the underlayer 100 (point $P_{12}$) to the inner edge $P_1$ of the partition wall 107. Further, $a_2$ denotes an average film thickness of the hole transport layer 108 in a region $A_{ave}$ above the level portion of the underlayer 100. If b and $a_2$ are defined as described above, the following relationship is satisfied.

$$(b/a_2) \le 15 \quad [\text{Math 3}]$$

In the organic EL panel 10 pertaining to the present embodiment, by defining the relationship between the height b and the average film thickness $a_2$ such that Math 3 is satisfied, occurrence of areas not covered by an organic film formed by application (the hole transport layer 108) is prevented and occurrence of uneven luminance is suppressed. Accordingly, the organic EL panel 10 pertaining to the present embodiment has excellent light-emitting performance.

On the other hand, as illustrated in FIG. 10A, in a case in which an average film thickness $a_3$ ($a_2$) of a hole transport layer 958 has a sufficiently low value that Math 3 is not satisfied, and, as illustrated in FIG. 10B, in a case in which a height $b_1$ (b) of an inner edge $P_4$ of a partition wall 957 has a sufficiently high value that Math 3 is not satisfied, a portion of the surface of the hole injection layer 106 is not covered by the hole transport layer 958, 968, causing occurrence of an uncovered area $A_{non}$. Specifically, in the example illustrated in FIG. 10A, an end position $P_3$ of the surface of the hole transport layer 958 is below the inner edge $P_1$ of the partition wall 107 in the Z-axis direction, and, in the example illustrated in FIG. 10B, an inner edge $P_4$ of the partition wall 957 is higher in the Z-axis direction than in the embodiment illustrated in FIG. 9 and is therefore higher in the Z-axis direction than an end position $P_5$ of the surface of the hole transport layer 968. In this way, in the examples illustrated in FIG. 10A and FIG. 10B, the uncovered area $A_{non}$ occurs.

6. Surface Profile of Hole Transport Layer 108

Figure 11:
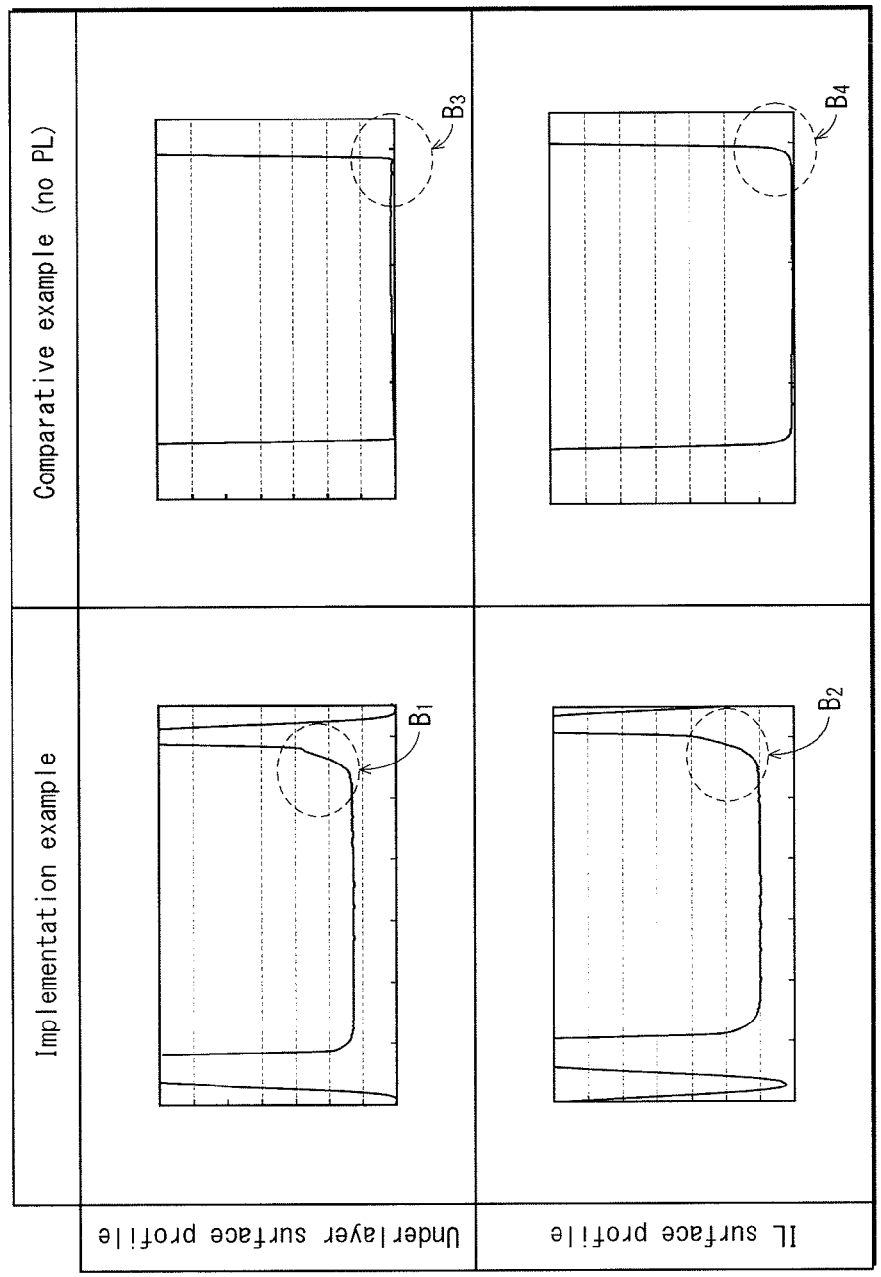
FIG. 11 is a schematic diagram illustrating an underlayer surface profile and a surface profile of a hole transport layer in an implementation example and a comparative example.
Figure 12:
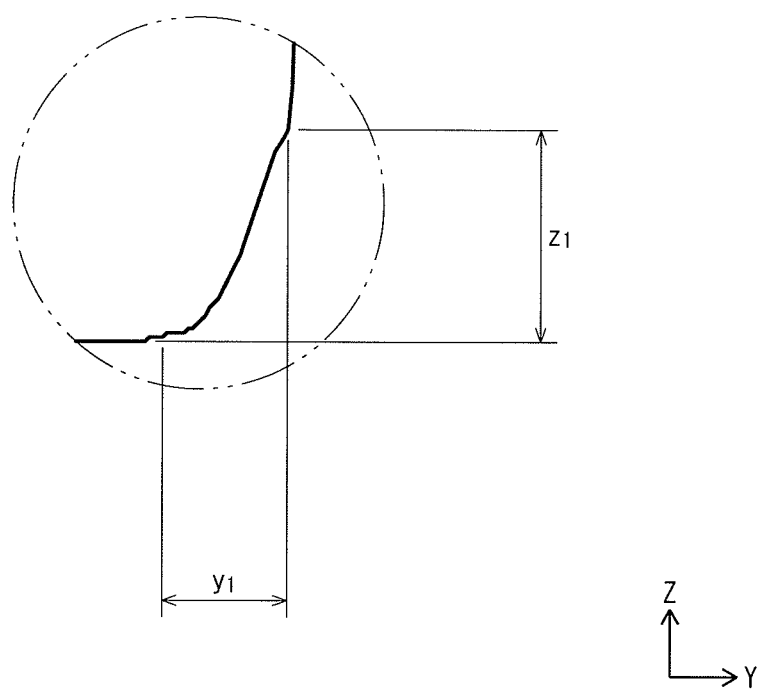
FIG. 12 is a schematic diagram illustrating a portion of the surface profile of the hole transport layer in the implementation example.

The surface profile of the hole transport layer (IL) 108 is described using FIG. 11 and FIG. 12.

First, as illustrated in FIG. 11, as a comparative example, a partition wall and a hole transport layer were formed above a level base without forming an interlayer insulating film. In such a case, as shown in the comparative example column, the hole transport layer was fainted having a surface profile close to that of the base near a corner portion (see circles B3, B4).

On the other hand, with respect to the implementation example shown in FIG. 11, on the right side a protruding portion exists alongside a contact hole (circle B1), and the surface profile of the hole transport layer had a form that followed the surface profile of the inclined surface of the protruding portion (circle B2).

As illustrated in FIG. 12, if a taper of a portion indicated by the circle B2 in FIG. 11 has a length in the Y-axis direction of $y_1$ and a height in the Z-axis direction of $z_1$, the following relationship is satisfied.

$$(z_1/y_1) \le 1.0 \times 10^2 \quad [\text{Math 4}]$$

7. Ink Application Quantity and Relationship with Occurrence of Uncovered Areas

The relationship between ink application quantity and occurrence of uncovered areas when forming an organic film is described using FIG. 13, FIG. 14A to FIG. 14C, and FIG. 15A to FIG. 15C.

FIG. 13 shows a state after application in cases in which the height b (in FIG. 13, indicated as "underlayer protrusion height") of the inner edge of the partition wall was defined as 150 nanometers, and an ink drop quantity was varied from two drops (2 d) to 12 drops (12 d). Note that a photoluminescence emission state was observed to determine the state after application. Here, one drop is approximately 10 pl of ink.

As shown in FIG. 13, in the range of 2 d to 4 d, uncovered areas occurred, and areas $C_1$, $C_2$, and $C_3$ that did not emit light occurred. In such cases, the ratios of the height b to the film thicknesses a of the organic film (b/a) were 100, 37.5, and 25, respectively.

Next, when the ink drop quantity was in the range of 7 d to 10 d, uncovered areas did not occur and the state after application was satisfactory. In these cases, the ratios of b to a (b/a) were 15, 11.5, and 10.7, respectively.

Next, when the ink drop quantity was 11 d and greater, the ink overflowed from the recess that was formed by the partition wall surrounding an area.

As described above, in the scope of the present confirmatory experiment, the state after application was satisfactory with an ink drop quantity of 7 d to 10 d. In other words, when a ratio of b to a (b/a) was less than or equal to 15, the state after application was satisfactory. Note that although overflow depends on the total height of the partition wall, the ink not overflowing the partition wall is assumed.

Figure 14A:
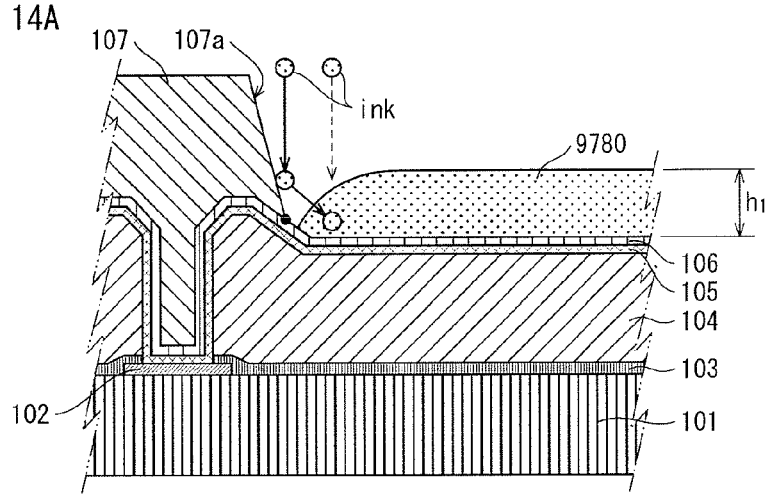
FIG. 14A and FIG. 14B are schematic cross-sectional views illustrating estimated surface profiles of ink directly after ink dropping pertaining to the comparative example.

As illustrated in FIG. 14A, for example, when ink having a concentration of 1% was used and an applied film 9780 was formed having a film thickness $h_1$ (for example, at most 100 nanometers), an uncovered area of the hole transport layer 106 occurred during application due to liquid repellency of the partition wall 107. When the applied film 9780 was dried, an organic film (hole transport layer) 978 was formed as illustrated in FIG. 15A.

The end position of the organic film (hole transport layer) 978 was separated from the inner edge of the partition wall 107, and the uncovered area $A_{non}$ occurred (area indicated by arrow D1). In this case, an average film thickness $a_4$ of the organic film (hole transport layer) 978 was less than or equal to 1 nanometer. Accordingly, a ratio of b to $a_4$ (b/$a_4$) had a value greater than or equal to 150.

Figure 14B:
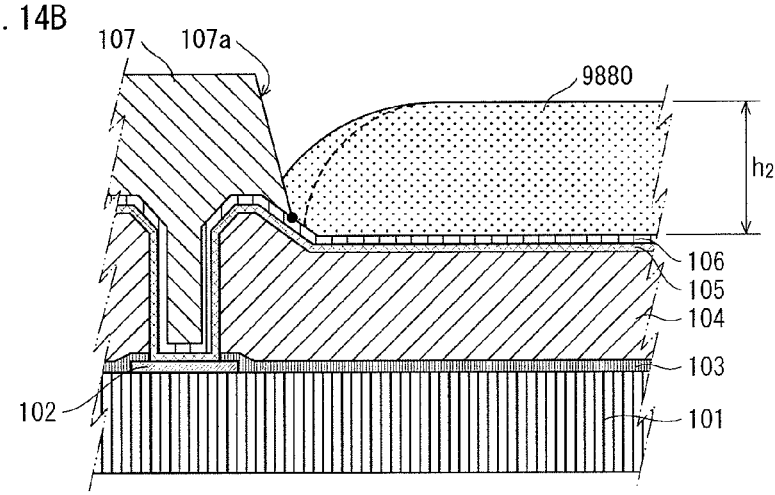

Next, as illustrated in FIG. 14B, when ink having a concentration of 1% was used as described above, and an applied film 9880 was formed having a film thickness $h_2$ (for example, at most 500 nanometers), a portion of the inclined surface 107a of the partition wall 107 was either covered (profile indicated by the solid line) or not covered (profile indicated by the broken line) depending upon liquid repellency of the partition wall 107. When the applied film 9880 was dried, an organic film (hole transport layer) 988 was formed as illustrated in FIG. 15B.

Figure 15A:
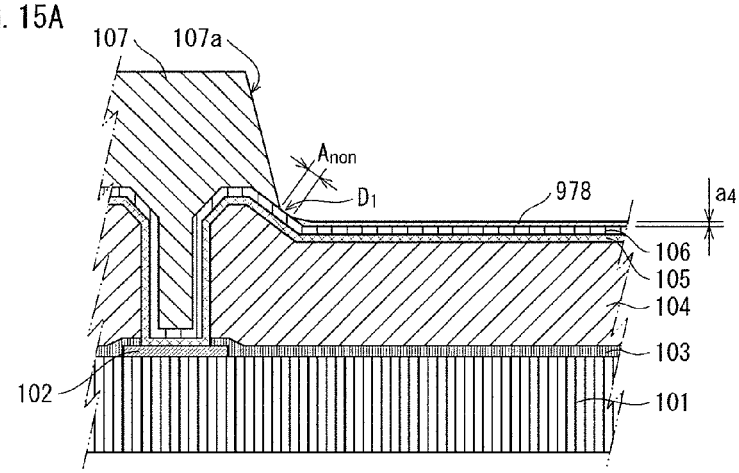
FIG. 15A to FIG. 15C each correspond to a respective one of FIG. 14A to FIG. 14C, and are schematic cross-sectional views illustrating an estimated surface profile of a hole transport layer after ink drying.
Figure 15B:
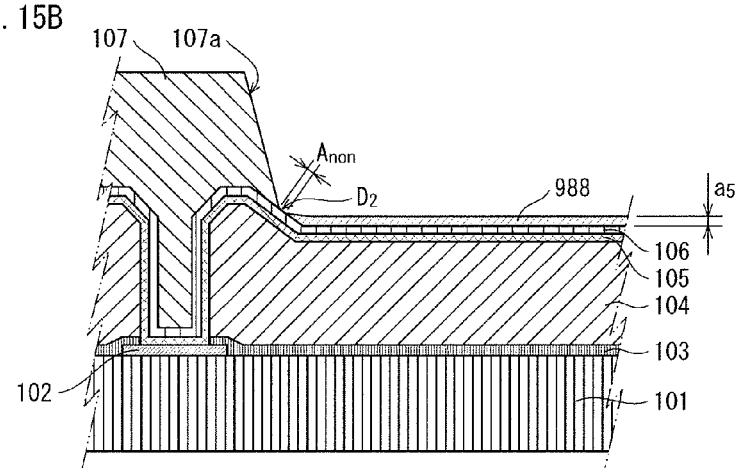

When the applied film 9880 had a profile as indicated by the broken line in FIG. 14B, a portion of the hole injection layer 106 was not covered by the organic film (hole transport layer) 988 and the uncovered area $A_{non}$ occurred, in the same way as for the organic film (hole transport layer) 978 illustrated in FIG. 15A. Further, even when the applied film 9880 had a profile as indicated by the solid line in FIG. 14B, a pinning position of the organic film (hole transport layer) 988 was lowered because of the liquid repellency of the partition wall 107, and the uncovered area $A_{non}$ indicated in FIG. 15B occurred. Here, an average film thickness $a_5$ of the organic film (hole transport layer) 988 was less than or equal to 5 nanometers. Accordingly, a ratio of b to $a_5$ (b/$a_5$) had a value greater than or equal to 30.

Figure 14C:
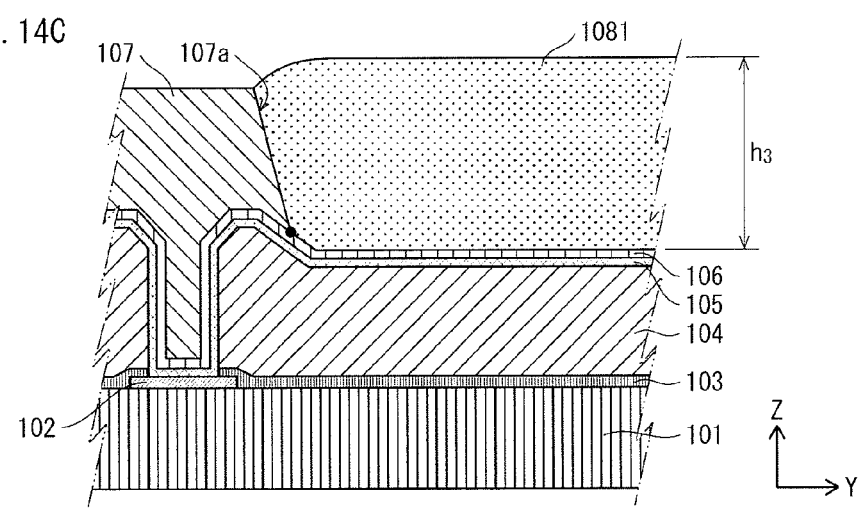
FIG. 14C is a schematic cross-sectional view illustrating an estimated surface profile of ink directly after ink dropping pertaining to the implementation example.

Next, as illustrated in FIG. 14C, ink having a concentration of 1% was used as described above, and when an applied film 1081 was formed having a film thickness $h_3$ (for example, 1 μm), the inclined surface 107a of the partition wall 107 was substantially entirely covered due to liquid repellency of the partition wall 107. When the applied film 1081 was dried, the organic film (hole transport layer) 108 was formed as illustrated in FIG. 15C.

Figure 15C:
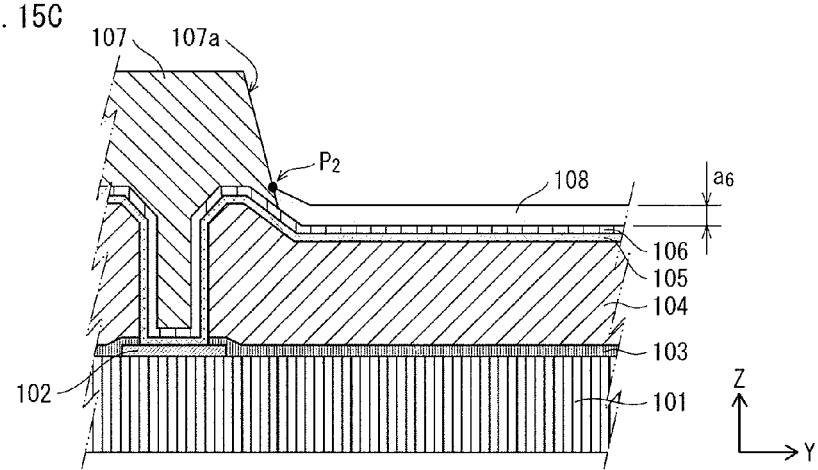

As illustrated in FIG. 15C, the organic film (hole transport layer) 108 covered the entirety of the surface of the hole injection layer 106 that was not covered by the partition wall 107, and an uncovered area did not occur. Thus, the surface of the organic film (hole transport layer) 108 contacted the inclined surface 107a of the partition wall 107 at a contact point $P_2$. Here, an average film thickness $a_6$ of the organic film 108 was greater than or equal to 10 nanometers. Accordingly, a ratio of b to $a_6$ ($b/a_6$) had a value less than or equal to 15.

As described above, by defining the height b of the inner edge $P_1$ of the partition wall 107 with respect to the surface of the underlayer 100 and the average film thickness $a_2$ of the level portion of the organic film (hole transport layer) 108 so as to satisfy the relationship of the above-described Math 3, occurrence of an uncovered area is prevented and the organic EL panel 10 having excellent light-emitting performance and long life is achieved.

Further, when also taking into account film thickness of the applied film 1081 (thickness $h_3$ in FIG. 15C), the following relationship is preferably satisfied.

$$h_3 > b \quad \text{[Math 5]}$$

Note that in the above-described embodiment 1, occurrence of an uncovered area of the organic film (hole transport layer) 108 is prevented, and a safe range is ensured for ink drop numbers that do not overflow the recess that is formed by the partition wall 107 surrounding an area. Thus, it is possible to design a printed film thickness tailored for each light-emission color of the sub-pixels 11a, 11b, 11c in the same ink concentration. Accordingly, an ideal optical cavity design is possible for each light-emission color, and improved luminance is achieved.

Embodiment 2

Figure 16:
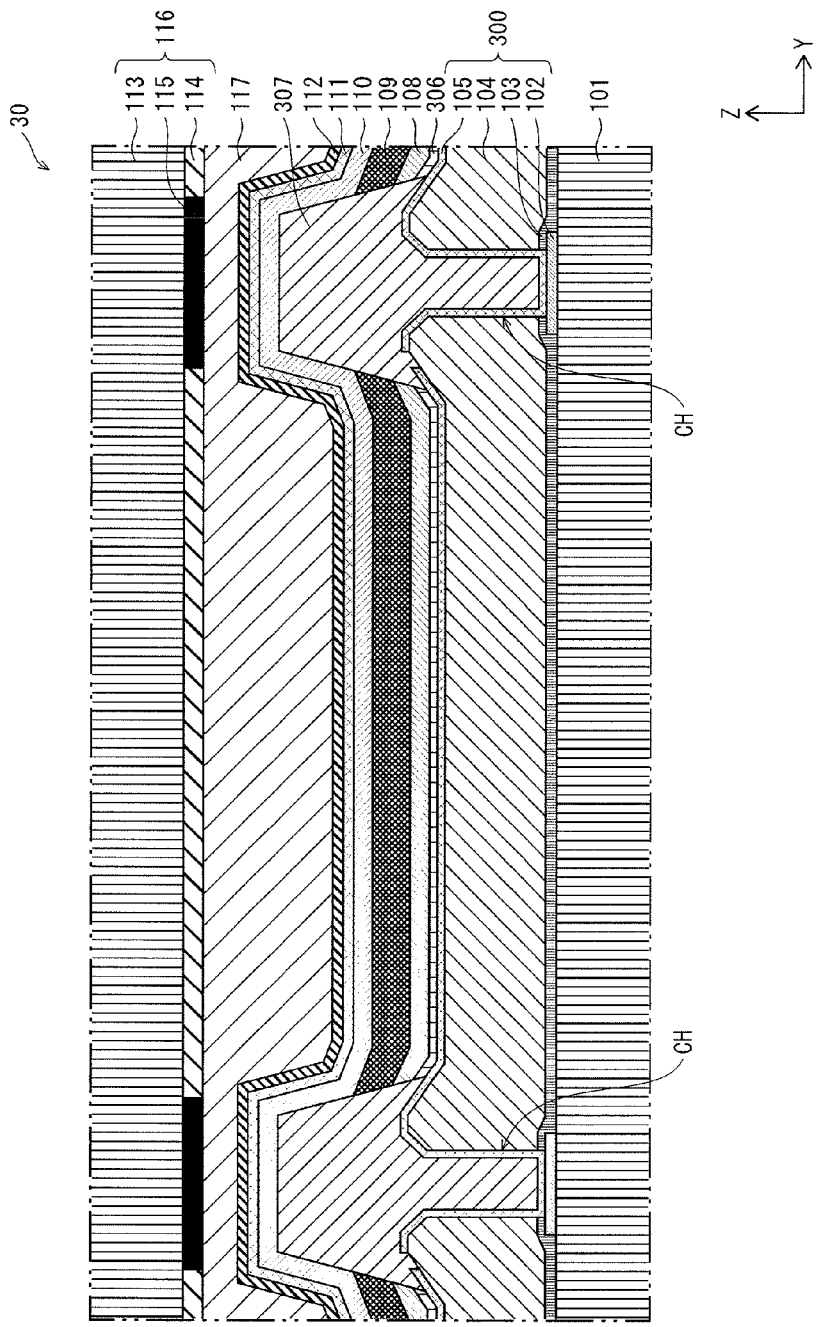
FIG. 16 is a schematic cross-sectional diagram illustrating a structure of a portion of an organic EL panel 30 pertaining to embodiment 2 of the present invention.
Figure 17:
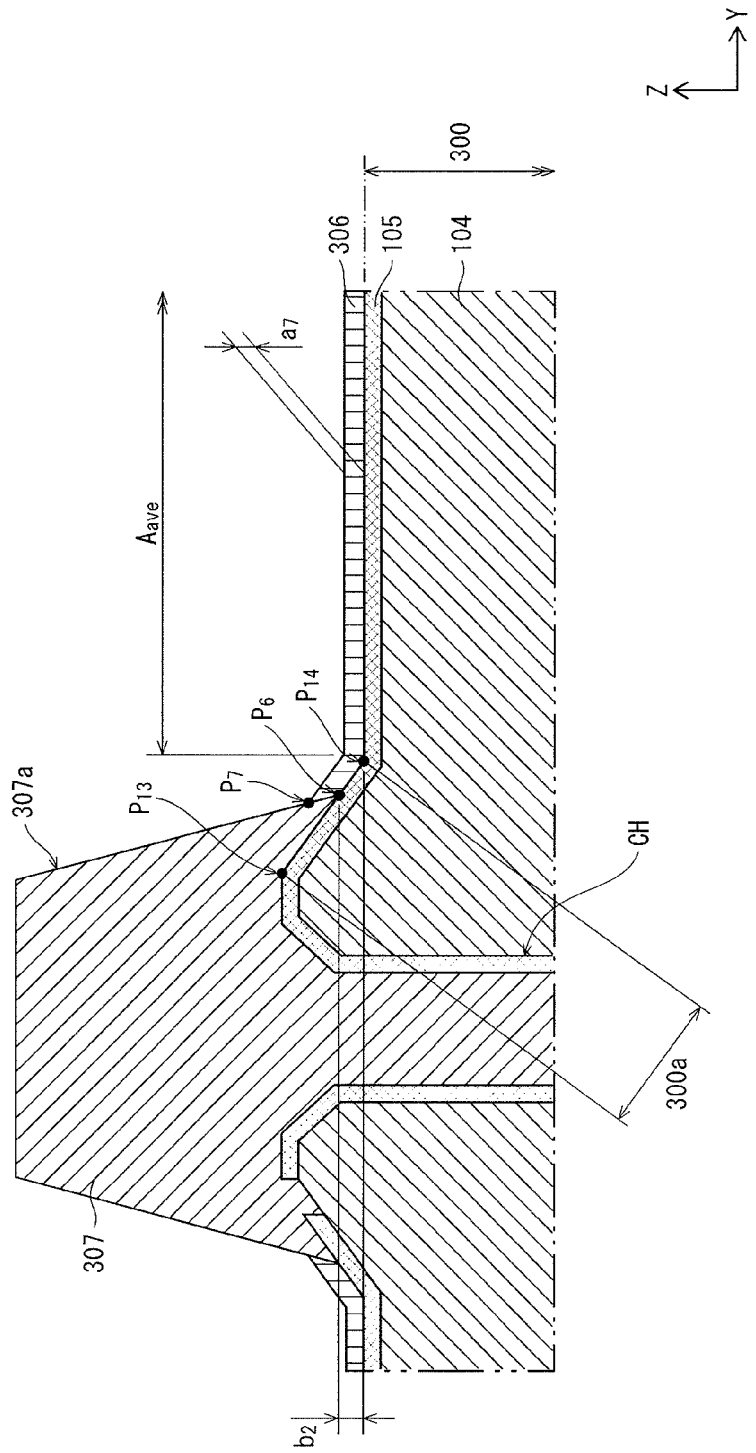
FIG. 17 is a schematic cross-sectional view illustrating a relationship between height of an inner edge of a partition wall 307 and film thickness of a hole injection layer 306 in the organic EL panel 30.

Next, configuration of an organic EL panel 30 pertaining to embodiment 2 is described using FIG. 16 and FIG. 17. FIG. 16 is schematic cross-sectional view corresponding to FIG. 3 in embodiment 1, and FIG. 17 is a schematic cross-sectional view corresponding to FIG. 9 in embodiment 1.

As illustrated in FIG. 16, the structure of the organic EL panel 30 from the substrate 101 to the anode 105, and from the hole transport layer 108 to the CF substrate 116, is the same as in the above-described embodiment 1. In the present embodiment, the hole injection layer 306 and the partition wall 307 are different from their equivalents in embodiment 1.

Specifically, in the organic EL panel 30 pertaining to the present embodiment, the partition wall 307 is formed above the anode 105, and the structure from the TFT 102 to the anode 105 is an underlayer 300. Further, the hole injection layer 306 pertaining to the present embodiment is an organic film including an electrically conductive polymer such as PEDOT:PSS (a polymer mixture of Poly(3,4-ethylenedioxythiophene) and polystyrene sulfonic acid) and is formed by using an application method within a recess that is formed by the partition wall 307 surrounding an area.

As illustrated in FIG. 17, in the organic EL panel 30 pertaining to the present embodiment, an inner edge $P_6$ of the partition wall 307 is in contact with the surface of the underlayer 300, which is the surface of the anode 105, at a position along an inclined surface 300a of the protruding portion of underlayer 300. Specifically, the inner edge $P_6$ of the partition wall 307 contacts the inclined surface 300a of the protruding portion at a position between two end points $P_{13}$ and $P_{14}$. The hole injection layer 306, which is an organic film, is formed so as to cover the entirety of the anode 105 that is not covered by the partition wall 307 and a portion of an inclined surface 307a of the partition wall 307. The surface of the hole injection layer 306 contacts the inclined surface 307a of the partition wall 307 at a contact point $P_7$.

Here, $b_2$ denotes a height in the Z-axis direction from a lower end position of the protruding portion of the underlayer 300 (point $P_{14}$) to the inner edge $P_6$ of the partition wall 307. Further, $a_7$ denotes an average film thickness of the hole injection layer 306 in a region $A_{ave}$ above the level portion of the underlayer 300. If $b_2$ and $a_7$ are defined as described above, the following relationship is satisfied.

$$(b_2/a_7) \leq 15 \quad \text{[Math 6]}$$

In the organic EL panel 30 pertaining to the present embodiment, by defining the relationship between the height $b_2$ and the average film thickness $a_7$ such that Math 6 is satisfied, occurrence of areas not covered by an organic film formed by application (the hole injection layer 306) is prevented and occurrence of uneven luminance is suppressed. Accordingly, the organic EL panel 30 pertaining to the present embodiment has excellent light-emitting performance.

Embodiment 3

Figure 18:
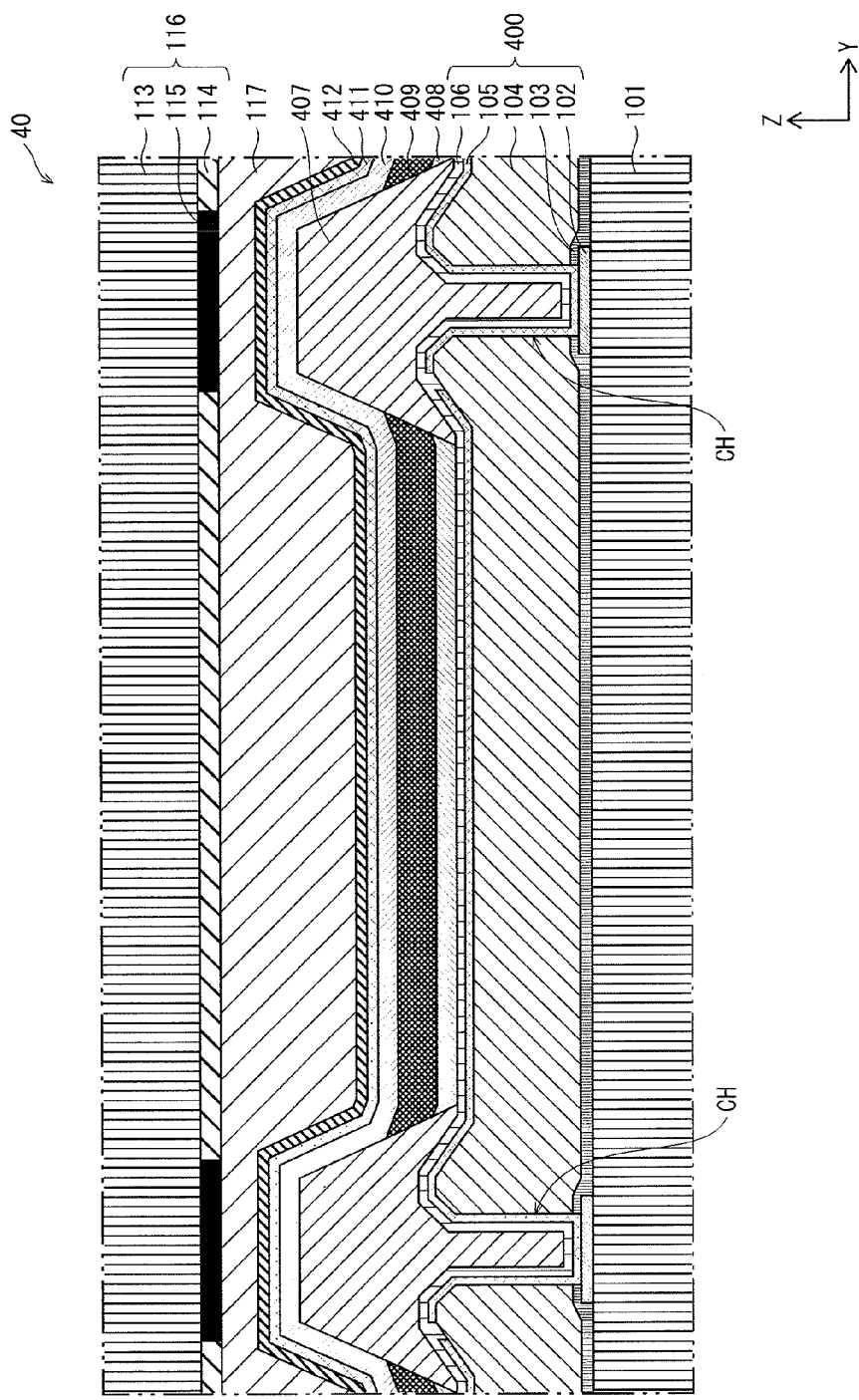
FIG. 18 is a schematic cross-sectional diagram illustrating a structure of a portion of an organic EL panel 40 pertaining to embodiment 3 of the present invention.
Figure 19:
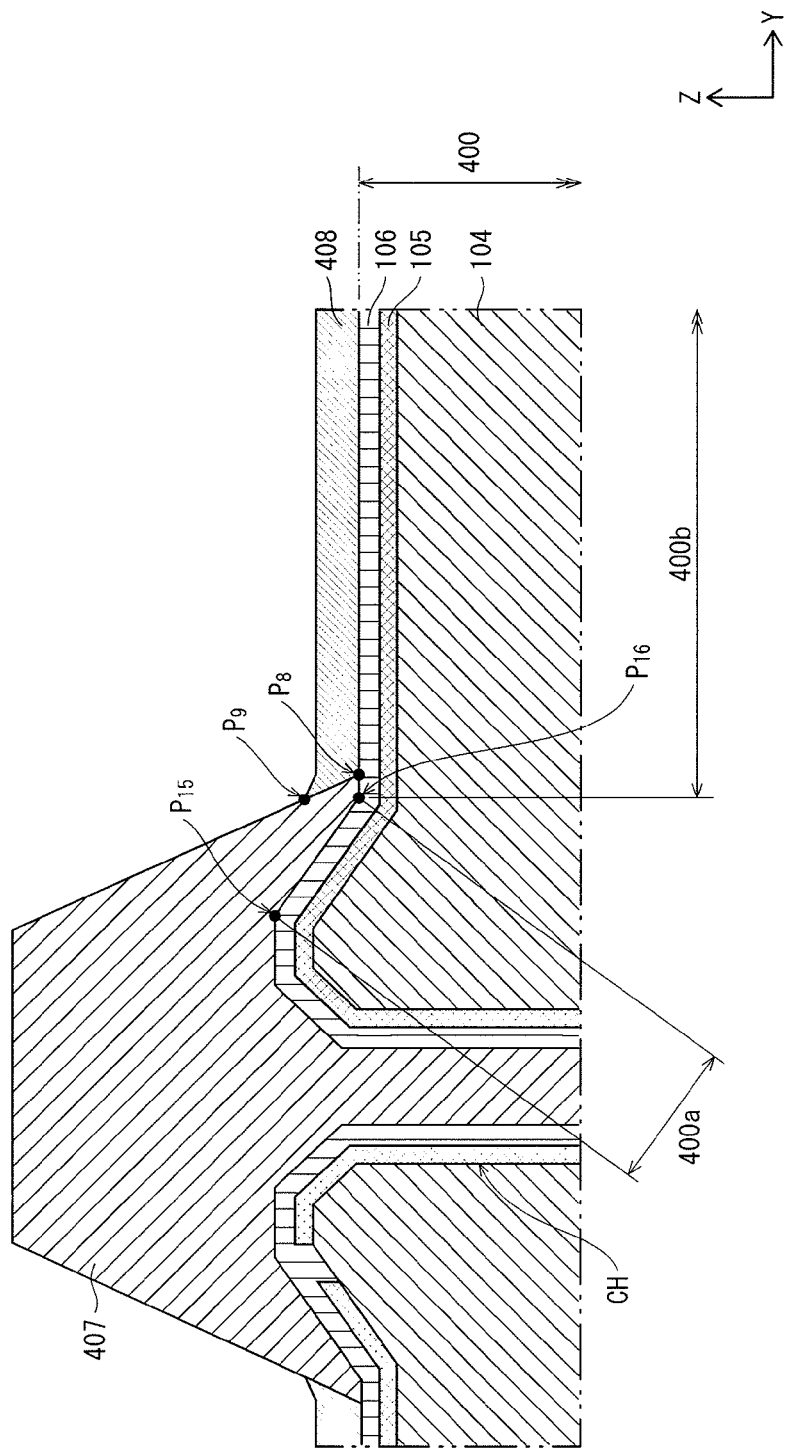
FIG. 19 is a schematic cross-sectional view illustrating a position of an inner edge of a partition wall 407 in the organic EL panel 40.

Next, configuration of an organic EL panel 40 pertaining to embodiment 3 is described using FIG. 18 and FIG. 19. FIG. 18 is schematic cross-sectional view corresponding to FIG. 3 in embodiment 1, and FIG. 19 is a schematic cross-sectional view corresponding to FIG. 4 in embodiment 1.

The basic structure of the organic EL panel 40 pertaining to an embodiment of the present invention is the same as that of the above-described organic EL panel 10 pertaining to embodiment 1, with the exception of the form of a partition wall 407.

A feature of the organic EL panel 40 pertaining to the present embodiment is that an inner edge of the partition wall 407 is positioned at a level portion of the surface of an underlayer 400, which is the surface of the hole injection layer 106. The structure of the organic EL panel 40 is the same as described above, in that a hole transport layer 408 and a light-emitting layer 409 are formed in a recess formed by the partition wall 407 surrounding an area, and in successive unbroken layers above the light-emitting layer 409 and the partition wall 407, an electron injection layer 410, a cathode 411, and a sealant layer 412 are disposed in the order stated. However, in the present embodiment, the entirety of the protruding portion of the interlayer insulating film 104, which is caused by the contact hole CH, is covered by the partition wall 407.

As illustrated in FIG. 19, the surface of the underlayer 400, which is the surface of the hole injection layer 106, has a portion that protrudes in an upward direction, which is caused by the contact hole CH, and an inclined surface 400a between an end point $P_{15}$ and an end point $P_{16}$. In the above-described embodiments 1 and 2, inner edges of the partition walls are positioned at the inclined surface 400a, but in the present embodiment, an inner edge $P_8$ of the partition wall 407 is positioned at a level portion 400*b* further toward the center of a recess than an end point $P_{16}$ of the inclined surface 400*a* of the protruding portion of the underlayer 400.

In the organic EL panel 40 pertaining to the present embodiment, similar to embodiment 1, an end position $P_9$ of the surface of the hole transport layer 408, which is an organic film formed above the hole injection layer 106, is positioned at an inclined surface of the partition wall 407.

By using such a structure, occurrence of an uncovered area during formation of the hole transport layer 408 is reliably prevented, and excellent light-emitting performance is achieved.

Further, when the structure of the organic EL panel 40 pertaining to the present embodiment is used, even in a case in which an organic film is formed above the underlayer 400 using a vapor-deposition method, film thickness uniformity of the organic film is ensured, and luminance concentration is suppressed. Accordingly, even in a case in which an organic film is formed using a vapor-deposition method, the organic EL panel 40 having long life is achieved.

Embodiment 4

Figure 20:
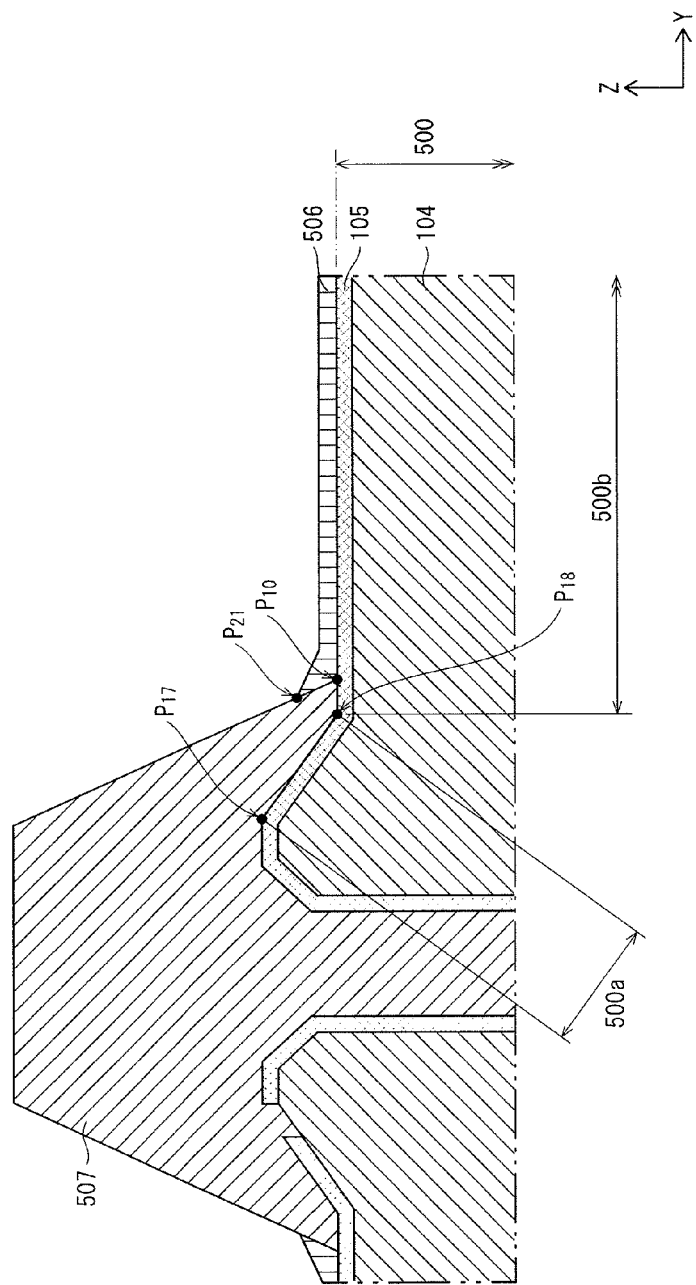
FIG. 20 is a schematic cross-sectional diagram illustrating a structure of a portion of an organic EL panel pertaining to embodiment 4 of the present invention.
Figure 21:
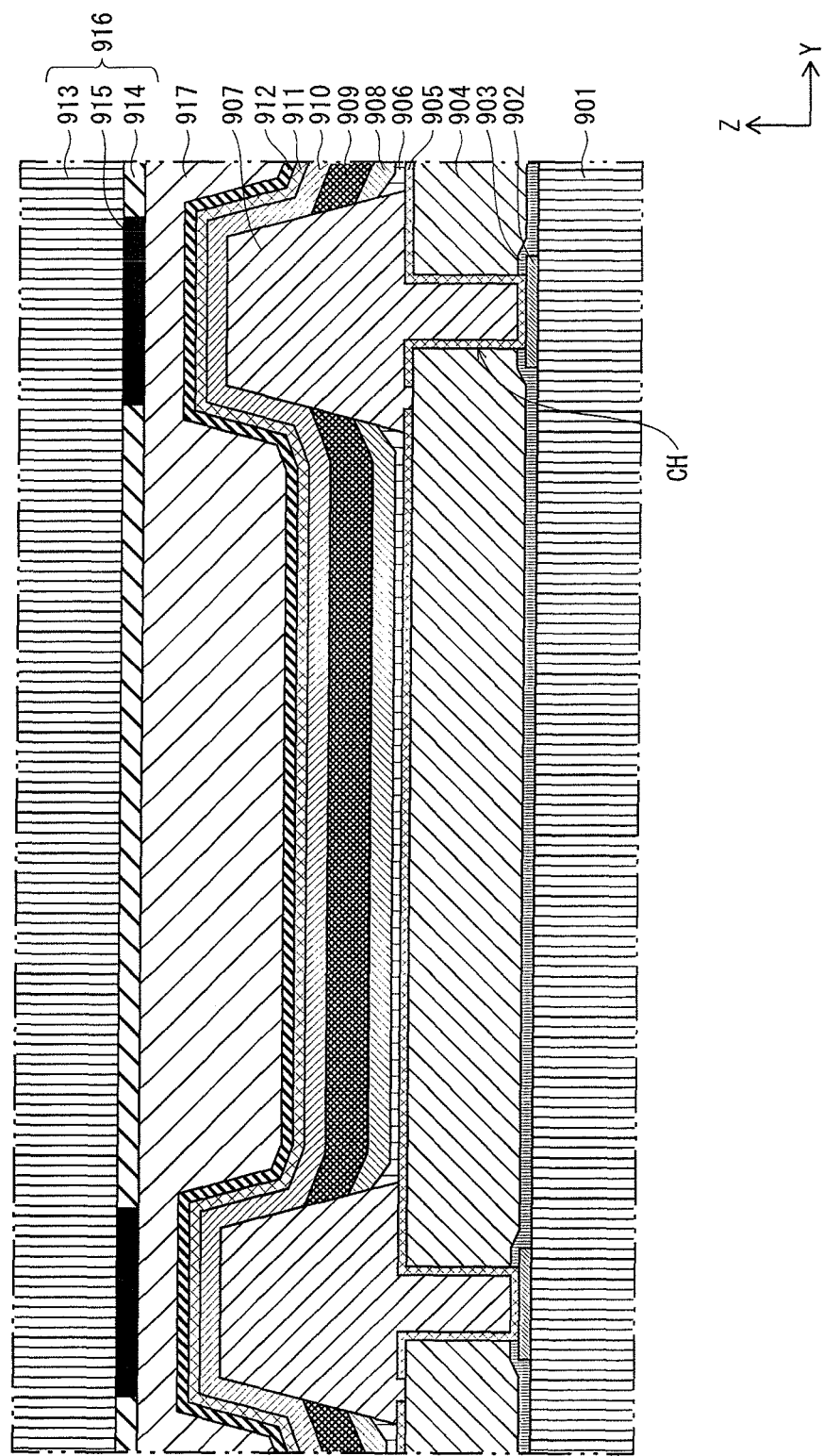
FIG. 21 is a schematic cross-sectional diagram illustrating a structure of a portion of an organic EL panel pertaining to conventional technology.

Next, the structure of an organic EL panel pertaining to embodiment 4 of the present invention is described using FIG. 20. FIG. 20 is a schematic cross-sectional view corresponding to FIG. 4 in embodiment 1.

The organic EL panel pertaining to the present embodiment combines elements of the above-described embodiment 2 and the above-described embodiment 3. Specifically, as illustrated in FIG. 20, the surface of the anode 105 is the surface of the underlayer 500, a portion of which is a protruding portion caused by the contact hole CH. The anode 105 is formed following the surface of the interlayer insulating film 104, and a surface thereof (the surface of the underlayer 500) is also protruding.

The partition wall 507 is formed so as to cover the entirety of an inclined surface 500*a* of the protruding portion of the underlayer 500, including an end point $P_{17}$ and an end point $P_{18}$. An inner edge $P_{10}$ of the partition wall 507 is in contact with (positioned at) a level portion 500*b* further toward the center of a recess than the end point $P_{18}$ of the surface of the underlayer 500.

In the organic EL panel pertaining to the present embodiment, an end position $P_{21}$ is a position at the surface of the hole injection layer 506, which is an organic film formed above the anode 105. The end position $P_{21}$ is in contact with the inclined surface of the partition wall 507. Note that in the organic EL panel pertaining to the present embodiment, an electrically conductive polymer such as PEDOT:PSS (a polymer mixture of Poly(3,4-ethylenedioxythiophene) and polystyrene sulfonic acid) may be used as the formation material of the hole injection layer 506, the same way as in the hole injection layer 306 pertaining to embodiment 2.

By using such a structure, occurrence of an uncovered area during formation of the hole injection layer 506 is reliably prevented, and excellent light-emitting performance is achieved.

Further, when the structure of the organic EL panel pertaining to the present embodiment is used, even in a case in which an organic film is formed above the underlayer 500 using a vapor-deposition method, film thickness uniformity of the organic film is ensured and luminance concentration is suppressed, as in embodiment 3. Accordingly, even in a case in which an organic film is formed using a vapor-deposition method, the organic EL panel having long life is achieved.

[Supplement]

In embodiments 1-4, above, a so-called pixel bank structure is used as an example structure of the partition wall 107, 307, 407, 507. The present invention is not limited in this way and may, for example, use a line bank structure.

Further, the anode 105 may be formed using aluminium (Al), an aluminium alloy (Al alloy), silver (Ag), or a silver alloy (Ag alloy), as described above, or a different metal electrode having light reflectivity may be used.

Further, in embodiments 1-4, the present invention is applied to the organic EL panels 10, 30, 40, which are examples of an organic light-emitting device. However, the present invention is not limited in this way, and may be applied to other devices for lighting.

Further, in embodiments 1-4, a so-called top-emission device is described, but a bottom-emission device is also applicable.

INDUSTRIAL APPLICABILITY

The present invention is used to implement organic light-emitting devices having high light-emitting performance and long life.

REFERENCE SIGNS LIST

1: organic EL display device
10, 30, 40: organic EL panel
11: pixel
11*a*, 11*b*, 11*c*: sub-pixel
12: bus bar
20: drive/control unit
21, 22, 23, 24: drive circuit
25: control circuit
100, 300, 400, 500 underlayer
100*a*, 300*a*, 400*a*, 500*a*: inclined surface
400*b*, 500*b*: level portion
101: substrate
102: TFT (drain)
103, 1030: passivation film
104, 1040: interlayer insulating film
104*b*: protruding portion
104*b*$_1$: inclined surface
104*c*: level portion
105: anode
106, 306, 506: hole injection layer
107, 307, 407, 507: partition wall
108, 408: hole transport layer
109, 409: light-emitting layer
110, 411: electron injection layer
111, 411: cathode
112, 412: sealant layer
113: substrate
114: color filter
115: black matrix
116: CF substrate
117: adhesive resin layer
500: mask
1070: partition wall resin layer
1080, 1081, 1090: ink

The invention claimed is:

1. An organic light-emitting device, comprising:
   an underlayer disposed above a substrate;
   a partition wall that covers a first part of a surface of the underlayer and surrounds a second part of the surface of the underlayer; and
   an organic film that includes organic material, is disposed in a recess formed by the partition wall surrounding the second part, and is in contact with the surface of the underlayer and a surface of the partition wall, wherein
   the surface of the underlayer has a protruding portion that protrudes in an upward direction, to a greater height than a portion of the second part that does not overlap with the protruding portion, the protruding portion being composed of a top surface and an inclined surface, the inclined surface surrounding the top surface in a plan view, and
   the first part includes at least the top surface and a portion of the inclined surface, and an innermost edge of the partition wall is in contact with the inclined surface or a level portion of the surface of the underlayer that is not the protruding portion.

2. The organic light-emitting device of claim 1, wherein the organic film is formed by drying an applied film that is formed by applying ink that contains the organic material, and $(b/a2) \leq 15$ where a2 is an average film thickness in nanometers of the organic film above the level portion and b is a difference in height in nanometers of a position where the innermost edge of the partition wall contacts the surface of the underlayer and the level portion.

3. The organic light-emitting device of claim 1, wherein the organic film is formed by drying an applied film that is formed by applying ink that contains the organic material,
   the applied film covers an entirety of the level portion, a portion of the inclined surface not covered by the partition wall, and a portion of the partition wall,
   the applied film has a film thickness of a1 nanometers that is greater than b nanometers, and $(b/a2) \leq 15$ where a2 is an average film thickness in nanometers of the organic film above the level portion and b is a difference in height in nanometers of a position where the innermost edge of the partition wall contacts the surface of the underlayer and the level portion.

4. The organic light-emitting device of claim 1, wherein a difference in height of a position where the innermost edge of the partition wall contacts the surface of the underlayer and the level portion is not more than 150 nanometers.

5. The organic light-emitting device of claim 1, wherein the underlayer includes an interlayer insulating film that has a contact hole and an electrode that is disposed on a surface of the interlayer insulating film and surfaces defining the contact hole,
   the organic film is formed by drying an applied film that is formed by applying, on a surface of the electrode, ink that contains the organic material,
   the surface of the interlayer insulating film has a protruding portion in a periphery of the contact hole that protrudes in an upward direction,
   the electrode is disposed so as to follow the surface of the interlayer insulating film, such that a portion of the surface of the electrode above the protruding portion of the interlayer insulating film protrudes in an upward direction, and
   the surface of the electrode is the surface of the underlayer.

6. A method for manufacturing an organic light-emitting device, the method comprising:
   forming an underlayer above a substrate;
   forming a partition wall on the underlayer that covers a first part of a surface of the underlayer and surrounds a second part of the surface of the underlayer;
   forming an applied film by applying ink that contains organic material into a recess formed by the partition wall surrounding the second part; and
   forming, by drying the applied film, an organic film that is in contact with the surface of the underlayer and the surface of the partition wall, wherein
   in forming the underlayer, the surface of the underlayer has a protruding portion that protrudes in an upwards direction, to a greater height than a portion of the second part that does not overlap with the protruding portion, the protruding portion being composed of a top surface and an inclined surface, the inclined surface surrounding the top surface in a plan view, and
   in forming the partition wall, the first part includes at least the top surface and a portion of the inclined surface, such that an innermost edge of the partition wall is in contact with the inclined surface or a level portion of the surface of the underlayer that is not the protruding portion.

7. A method for manufacturing an organic light-emitting device, the method comprising:
   forming an underlayer above a substrate;
   forming a partition wall on the underlayer that covers a first part of a surface of the underlayer and surrounds a second part of the surface of the underlayer;
   forming an applied film by applying ink that contains organic material into a recess formed by the partition wall surrounding the second part; and
   forming, by drying the applied film, an organic film that is in contact with the surface of the underlayer and the surface of the partition wall, wherein:
   in forming the underlayer, the surface of the underlayer has a protruding portion that protrudes in an upwards direction, to a greater height than a portion of the second part that does not overlap with the protruding portion, the protruding portion being composed of a top surface and an inclined surface, the inclined surface surrounding the top surface in a plan view;
   in forming the partition wall, the first part includes at least the top surface and a portion of the inclined surface, such that an innermost edge of the partition wall is in contact with the inclined surface or a level portion of the surface of the underlayer that is not the protruding portion;
   in forming the applied film, the applied film is applied so as to cover an entirety of the level portion, a portion of the inclined surface of the protruding portion not covered by the partition wall, and a portion of the partition wall, and is applied so as to have a film thickness of a1 nanometers that is greater than b nanometers; and
   in forming the organic film, $a1 > a2 \geq (b/15)$ where a2 is an average film thickness in nanometers of the organic film above the level portion and b is a difference in height in nanometers of a position where the innermost edge of the partition wall contacts the surface of the underlayer and the level portion.

8. The organic light-emitting device of claim 1, wherein the innermost edge of the partition wall contacts the inclined surface of the protruding portion of the underlayer.

9. The organic light-emitting device of claim 1, wherein the underlayer includes a contact hole, and
the protruding portion surrounds the contact hole in the plan view.

10. The organic light-emitting device of claim 9, wherein the contact hole comprises a cylindrical shape, and
the top surface of the protruding portion and the inclined surface of the protruding portion each surround the contact hole in the plan view.

11. The organic light-emitting device of claim 10, wherein the partition wall is in the contact hole.

12. The organic light-emitting device of claim 1, wherein the inclined surface of the protruding portion has a band-shape that surrounds the top surface in the plan view.

13. The organic light-emitting device of claim 1, wherein the inclined surface of the protruding portion circumferentially surrounds the top surface in the plan view.

* * * * *